United States Patent
Konopka et al.

(10) Patent No.: US 12,431,728 B2
(45) Date of Patent: Sep. 30, 2025

(54) SYSTEMS AND METHODS FOR ELECTROCHEMICAL DEVICE CHARGING AND DISCHARGING

(71) Applicant: Iontra Inc, Centennial, CO (US)

(72) Inventors: Daniel A. Konopka, Denver, CO (US); John Richard Howlett, III, Centennial, CO (US); Jeffrey J. Holt, Superior, CO (US)

(73) Assignee: Iontra Inc, Centennial, CO (US)

( * ) Notice: Subject to any disclaimer, the term of this patent is extended or adjusted under 35 U.S.C. 154(b) by 350 days.

(21) Appl. No.: 17/390,851

(22) Filed: Jul. 30, 2021

(65) Prior Publication Data
US 2022/0029443 A1      Jan. 27, 2022

Related U.S. Application Data

(63) Continuation-in-part of application No. 17/232,975, filed on Apr. 16, 2021.

(60) Provisional application No. 63/059,044, filed on Jul. 30, 2020, provisional application No. 63/011,832, filed on Apr. 17, 2020.

(51) Int. Cl.
*H02J 7/00* (2006.01)
*G01R 31/382* (2019.01)

(52) U.S. Cl.
CPC ........ *H02J 7/00712* (2020.01); *G01R 31/382* (2019.01); *H02J 7/0047* (2013.01)

(58) Field of Classification Search
CPC ................................................ H02J 7/00711
See application file for complete search history.

(56) References Cited

U.S. PATENT DOCUMENTS

| | | | |
|---|---|---|---|
| 4,878,007 A * | 10/1989 | Gabor | H02J 7/00711 320/136 |
| 5,436,512 A | 7/1995 | Inam et al. | |
| 5,589,757 A | 12/1996 | Klang et al. | |
| 5,614,805 A * | 3/1997 | Momotani | H02J 7/00711 320/139 |
| 5,949,216 A * | 9/1999 | Miller | H02J 7/00 320/140 |

(Continued)

FOREIGN PATENT DOCUMENTS

| | | | |
|---|---|---|---|
| CN | 117526463 A * | 2/2024 | |
| WO | 2019230157 A1 | 12/2019 | |

(Continued)

OTHER PUBLICATIONS

CN117526463_translation,GAO,2024,Charging Method And Device Thereof, Storage Medium and Program Product.*

(Continued)

*Primary Examiner* — Tynese V McDaniel
(74) *Attorney, Agent, or Firm* — Gregory P. Durbin; Polsinelli PC

(57) ABSTRACT

Systems and methods that charge a battery using a signal with at least one harmonically tuned aspect based on impedance of the battery with a frequency or harmonic component. The system may further involve a power converter that may act in concert with charging to power a load. In some instances, an output signal is generated that is interleaved with the charge signal. Further, the output signal may be tuned based on output impedance to the discharge signal.

12 Claims, 26 Drawing Sheets

(56) References Cited

U.S. PATENT DOCUMENTS

| | | | |
|---|---|---|---|
| 6,850,039 B2 | 2/2005 | Popescu | |
| 2003/0022640 A1 | 1/2003 | Sorrells et al. | |
| 2006/0036382 A1 | 2/2006 | Paz et al. | |
| 2007/0114970 A1* | 5/2007 | Johnson | H02J 7/00 320/128 |
| 2009/0085525 A1 | 4/2009 | Smith et al. | |
| 2010/0201320 A1* | 8/2010 | Coe | H02J 7/0069 320/136 |
| 2011/0140673 A1* | 6/2011 | Zhang | H02J 7/00306 320/145 |
| 2015/0035595 A1 | 2/2015 | Harwalkar et al. | |
| 2015/0258907 A1 | 9/2015 | Lee | |
| 2016/0059724 A1* | 3/2016 | Choi | B60L 3/04 320/109 |
| 2017/0219660 A1 | 8/2017 | Christensen et al. | |
| 2018/0059191 A1* | 3/2018 | Abu Qahouq | G01R 31/392 |
| 2018/0090945 A1* | 3/2018 | Langlinais | H02J 7/0045 |
| 2018/0205313 A1 | 7/2018 | Greetham et al. | |
| 2018/0321326 A1 | 11/2018 | Tanaka et al. | |
| 2019/0072618 A1 | 3/2019 | Ghantous et al. | |
| 2019/0120910 A1 | 4/2019 | Ghantous et al. | |
| 2019/0267900 A1* | 8/2019 | Uehara | H02M 3/1584 |
| 2024/0022090 A1* | 1/2024 | Choi | H02J 7/007184 |
| 2024/0053403 A1* | 2/2024 | Wang | G01R 31/367 |
| 2024/0088696 A1* | 3/2024 | Howlett, III | H01M 10/443 |

FOREIGN PATENT DOCUMENTS

| | | |
|---|---|---|
| WO | 2022026934 A1 | 2/2022 |
| WO | 2022026934 A9 | 4/2023 |

OTHER PUBLICATIONS

International Searching Authority, Transmittal of International Search Report and Written Opinion, issue for PCT/US2021/044083, mailed Nov. 5, 2021.

* cited by examiner

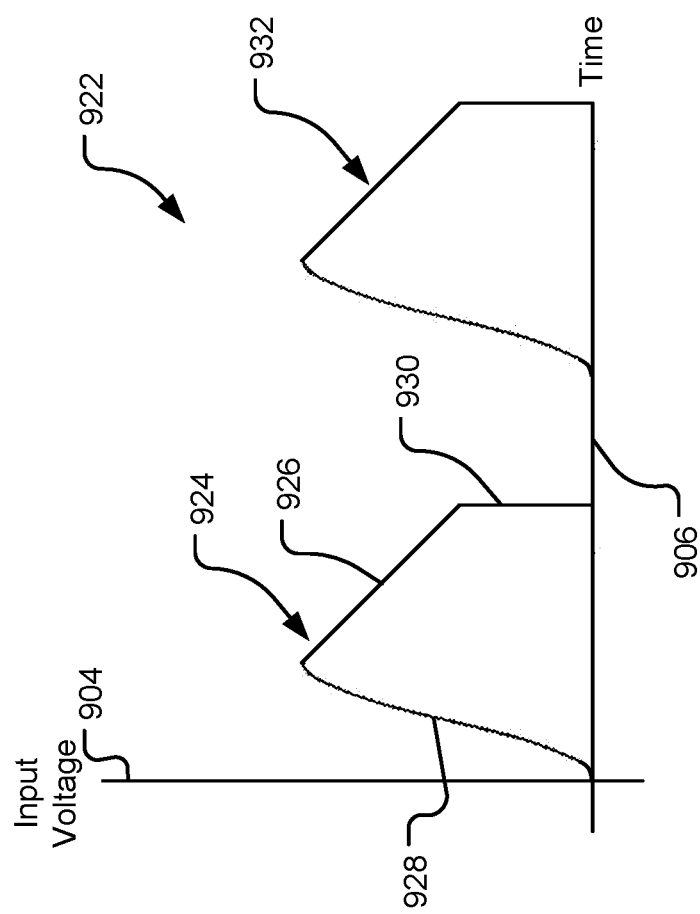

SYSTEMS AND METHODS FOR ELECTROCHEMICAL DEVICE CHARGING AND DISCHARGING

CROSS-REFERENCE TO RELATED APPLICATIONS

This Patent Cooperation Treaty (PCT) application is related to and claims priority from U.S. Patent Application No. 63/059,044 filed Jul. 30, 2020 entitled "Systems and Methods for Electrochemical Device Charging and Discharging," the entire contents of which is incorporated herein by reference. This application is also related to co-pending U.S. patent application Ser. No. 17/232,975 filed Apr. 16, 2021 entitled "Systems and Methods for Battery Charging," which is incorporated herein by reference for all purposes.

TECHNICAL FIELD

Embodiments of the present invention generally relate to systems and methods for charging of a battery, and more specifically for a generation of a high-efficiency and/or high-rate charging signal to charge a battery.

BACKGROUND AND INTRODUCTION

Many electrically powered devices, such as power tools, vacuums, any number of different portable electronic devices, and electric vehicles, use rechargeable batteries as a source of operating power. Rechargeable batteries are limited by finite battery capacity and must be recharged upon depletion. Recharging a battery may be inconvenient as the powered device must often be stationary during the time required for recharging the battery. In the case of vehicles, recharging can take hours. As such, significant effort has been put into developing rapid charging technology to reduce the time needed to recharge the battery. However, rapid recharging systems are typically inefficient while lower rate recharging systems prolong the recharging operation, undermining the basic objective of a quick return to service.

At perhaps the simplest level, shown in FIG. 1A, battery charging involves applying a DC charge current to a battery. Various battery types, however, can only accept so much current before damaging the battery. FIG. 1A illustrates a schematic of a simple circuit 100 for recharging a single cell battery. Other components of the circuit, such as a current meter volt-meter, controller, etc., are not illustrated. A battery 104 may be recharged through the application of a recharging power signal from a controllable power source 102. The various implementation discussed herein involving charging and discharging are applicable to electrochemical devices such as batteries. The term "battery" in the art can be used in various ways and may refer to an individual cell having an anode and cathode separated by an electrolyte as well as a collection of such cells connected in various arrangements. Batteries generally comprise repeating units of sources of a counterchange and first electrode layers separated by an ionically conductive barrier, often a liquid or polymer membrane saturated with an electrolyte. These layers are made to be thin so multiple units can occupy the volume of a battery, increasing the available power of the battery with each stacked unit. Although many examples are discussed herein as applicable to a battery, a cell or a battery cell, it should be appreciated that the systems and methods described may apply to many different type of cells, as well as batteries involving different possible interconnections of cells such as cells coupled in parallel, series, and parallel and series. For example, the systems and methods discussed herein may apply to a battery pack comprising numerous cells arranged to provide a defined pack voltage, output current, and/or capacity. Moreover, the implementations discussed herein may apply to different types of electrochemical devices such as various different types of lithium batteries including but not limited to lithium-metal and lithium-ion batteries, lead acid batteries, various types of nickel batteries, and solid state batteries, to name a few. The various implementations discussed herein may also apply to different structural battery arrangements such as button or "coin" type batteries, cylindrical cells, pouch cells, and prismatic cells. The application of the power signal to the electrodes of the battery 104 causes a reverse flow of electrons through the battery to replenish the stored concentration of charge carriers (such as lithium ions) at the anode. In one particular example, the power source 102 may be a direct current (DC) voltage source to provide a DC charge current to the battery cell 104. Other types of power sources, such as a current controlled source, may also be used.

In some fast charging scenarios, pulse charging has been explored. FIG. 1B illustrates a graph 110 of a prior art direct current voltage signal 122 produced by the power source 102 and applied to the battery cell 104 to recharge the battery. The graph illustrates an input voltage 112 versus time 114 of the charge signal 122. In general, the power source 102 may be controlled to provide a repeating pulse 122 to the electrodes of the battery cell 104 to recharge the battery cell. In particular, the power source 102 may be controlled to provide a repeating square-wave (illustrated as pulse 116 followed by pulse 118) signal to the battery cell 104. The peaks of the square-wave pulses 116, 118 may be less than or equal to a voltage threshold value 120 corresponding to operational constraints of the voltage source 102. A typical charge signal used to recharge a battery cell 104 may apply a charging signal during a charging period, with a rest period of some duration between application of the charging signal. The operation of the circuit 100 in this manner generates the illustrated power recharge signal 122 of FIG. 1B of a repeating square-wave pattern.

In some instances, however, applying a square-wave charge signal 122 to recharge a battery cell 104 may degrade the life of the battery cell under recharge or may introduce inefficiencies in the recharging of the battery. For example, the abrupt application of charge current (i.e., the sharp leading edge 124 of the square-wave pulse 116) to the electrode (typically the anode) of the battery cell 104 may cause a large initial impedance across the battery terminals. In particular, FIG. 1C illustrates a graph of estimated real impedance values of a battery cell 104 to corresponding frequencies of a recharge signal applied to the battery cell in accordance with one embodiment. In particular, the graph 150 illustrates a plot of real impedance values (axis 154) versus a logarithmic frequency axis (axis 152) of frequencies of an input signal to the battery cell 104. The plot 150 illustrates real impedance values across the electrodes of a battery cell 104 at the various frequencies of a recharge power signal used to recharge a battery. The shape and measured values of the plot 150 may vary based on battery type, state of charge of the battery, operational constraints of the battery, heat of the battery, and the like. However, a general understanding of the characteristics of a battery under charge may be obtained from the plot 158. In particular, real impedance values experienced at the electrodes of the battery cell 104 may vary based on the frequency of the power charge signal provided to the battery, with a general sharp increase in real impedance values 328 at high frequencies. For example, an input power signal to the battery cell 104 at frequency $f_{Sq}$ 162 may introduce a high real impedance 160 at the battery cell 104 electrodes.

Returning to the square-wave charge signal 122 of FIG. 1B, large frequencies of the signal may be present at the corners of the square-wave pulse 116. In particular, the rapid changes in the charge signal (such as the leading edge 124 of the pulse 116) to the battery cell 104 may introduce noise comprised of high-frequency harmonics, such as at the leading edge of the square-wave pulse, the tail edge of the square-wav pulse, and during use of conventional reverse pulse schemes. As shown in the graph 150 of FIG. 1C, such high harmonics result in a large impedance at the battery electrodes. This high impedance may result in many inefficiencies, including capacity losses, heat generation, and imbalance in electro-kinetic activity throughout the battery cell, undesirable electro-chemical response at the charge boundary, and degradation to the materials within the battery cell 104 that may damage the battery and degrade the life of the battery cell. Further, cold starting a battery with a fast pulse introduces limited faradaic activity as capacitive charging and diffusive processes set in. During this time, proximal lithium will react and be quickly consumed, leaving a period of unwanted side reactions and diffusion-limited conditions which negatively impact the health of the cell and its components. These and other inefficiencies are particularly detrimental during a fast recharging of the battery cell 104 where relatively higher currents are often involved.

It is with these observations in mind, among others, that various aspects of the present disclosure were conceived and developed.

SUMMARY

Aspects of the disclosure involve a charging system comprising a charge signal shaping circuit. The system further includes a controller in operable communication with the charge signal shaping circuit to control the charge signal shaping circuit to define a charge signal for the electrochemical device based on a harmonic associated with a value representative of a flow of electrical current to the electrochemical device. The system further includes a power converter operably coupled with the electrochemical device, the power converter to provide power to a load.

In another aspect, the power converter is in operable communication with the controller. The controller is configured to control the power converter to generate a discharge waveform from the electrochemical device based on a harmonic associated with a value representative of a flow of electrical current from the electrochemical device. In another aspect, the charge signal comprises a series of tuned charge pulses and the discharge signal comprises a series of tuned discharge pulses, the controller to control the charge signal shaping circuit and the power converter to interleave the series of tuned charge pulses with the series of tuned discharge pulses.

These and other aspects of the disclosure are described in further detail below.

BRIEF DESCRIPTION OF THE DRAWINGS

FIG. 9B is a signal diagram of a sequence of second shaped charge pulses generated from a battery charge circuit in accordance with one embodiment.

DETAILED DESCRIPTION

Figure 1B:
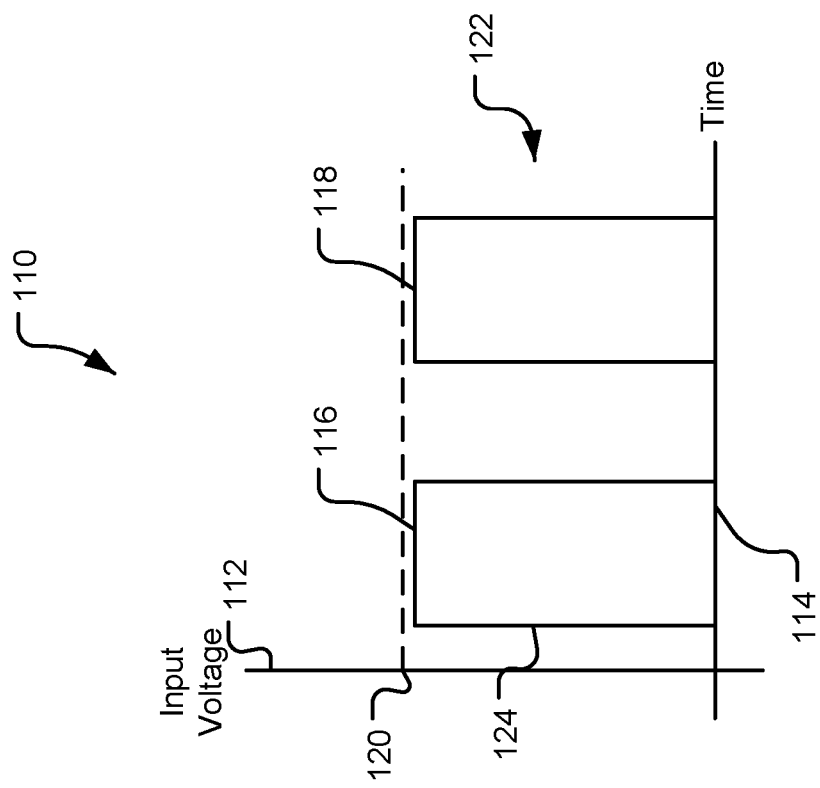
FIG. 1B is a signal diagram of a prior art direct current voltage or current signal for recharging a battery.
Figure 1A:
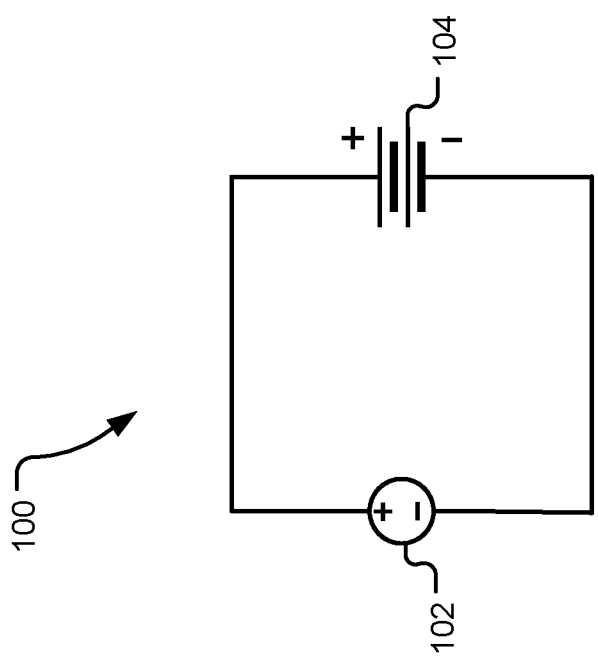
FIG. 1A is a schematic for a prior art circuit for charging a battery.
Figure 1C:
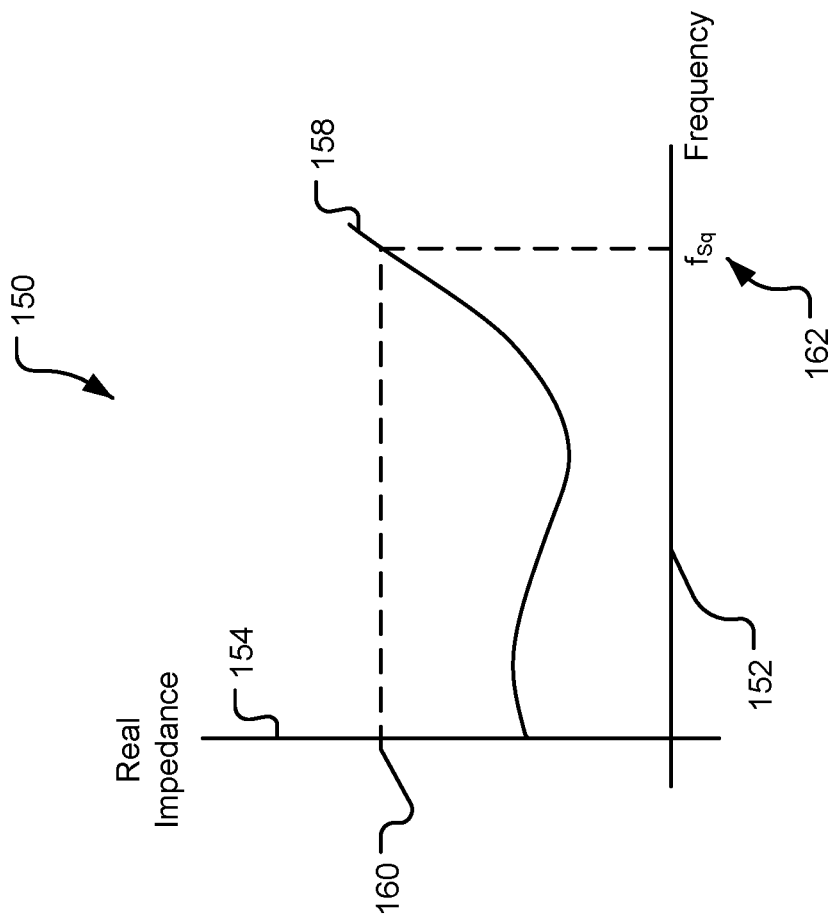
FIG. 1C is a graph of estimated real impedance values of a battery to corresponding frequencies of a charge signal applied to the battery in accordance with one embodiment.

Systems, circuits, and methods are disclosed herein for charging (recharging) a battery and for discharging a battery. The terms charging and recharging are used synonymously herein. Through the systems, circuits, and methods discussed, energy may be more efficiently charged or discharged from a battery than through previous charging circuits and methods. Besides energy efficiency, several other advantages are realized, alone or in combination with efficiency, as discussed herein. For example, the charging and/or discharging techniques described herein may reduce the rate at which an anode is damaged, may reduce heat generated during charging or discharging (or provide a way to control heating), which may have several follow on effects such as reducing anode and cell damage, reducing fire or short circuit risks, and the like. In other examples, the charging techniques described herein may allow for higher charging rates to be applied to a cell and may thus allow for faster charging. During what might be considered normal charging or discharging rates, the techniques described herein may provide for greater relative cycle depth and/or greater cycle life. In one example, during what might be considered "slow charging" of the battery, the disclosed systems and methods provide for a longer battery life and charging energy efficiency. In another example, in what might be considered "fast charging," the disclosed systems and methods provide an improved balance of charge rate and battery life, while producing less heat. While previous charging circuits have attempted to address the efficiency of the charging circuits by focusing on the electronic devices of the charging circuits, the disclosed systems, circuits, and methods provide an efficient battery charge signal when applied to charge a battery.

In one example, the various embodiments discussed herein charge and/or discharge a battery by generating pulses of a charge or discharge signal that corresponds to a frequency, or frequencies, which may be a harmonic or harmonics, associated with an optimal transfer of energy based on a real and/or an imaginary value of the energy transfer to and/or from the battery cell. In one example, the frequency may be associated with a minimum real impedance value of the battery. In another example, the pulses of the charge signal correspond to a harmonic associated with both the real and imaginary impedance value of the battery. In still another example, the pulses of the charge signal may correspond to a harmonic associated with one or both of a conductance or susceptance of an admittance of the battery cell. More particularly, systems and circuits are described that determine a frequency corresponding to the minimum impedance value. In some examples, since the frequency at which a minimum impedance occurs may change due to state of charge, temperature, and other factors, the techniques discussed herein may reassess the minimum impedance frequency. The circuits may shape or otherwise generate pulses of a charge signal (e.g., charge current) corresponding to the harmonics or frequencies associated with the minimum impedance. As introduced above, the state of charge and temperature fluctuate during recharging and discharging such that the frequency corresponding to the minimum impedance value may change due to the changes in material properties, chemical, and electro-chemical processes within the battery. The circuits may therefore, in some instances, perform an iterative process of monitoring or determining a frequency corresponding to the minimum impedance value of the battery and adjusting the charge and/or discharge pulses to or from the battery. This iterative process may improve the efficiency of the charge or discharge signals thereby decreasing the time to recharge the battery, extending the life of the battery (e.g., the number of charge and discharge cycles it may experience), optimizing the amount of current to or from the battery, and avoiding energy lost to various inefficiencies, among other advantages.

To generate the charge pulses with an appropriate harmonic component, a battery recharge circuit may include one or more charge pulse shaping circuits and an impedance measurement circuit, including both hardware components and/or software components, and/or application specific integrated circuits. In one particular implementation, the charge pulse shaping circuits may comprise a filter circuit controllable by a pulse control signal. The filter circuit may prevent fast changes in the charge pulse transmitted to the battery cell. In particular, the filter circuit may shape an input current square wave based on $Z=j\omega L$ such that, for high frequencies, current flow is limited, and, for low frequencies, current is allowed to flow through the circuit. Selection of components of the filter circuit may shape a leading edge of the charge pulse to maximize the power supplied to the battery cell while limiting the inefficient harmonics that are present in a conventional square-wave power signal. In addition, the pulse control signal to the filter circuit may configure the duration of each frequency-tuned charge pulse provided to the battery cell. The charge signal shaping circuit may also include a current shaping circuit controllable by a current shaping control signal. The current shaping circuit may, in one implementation, remove or siphon current from the charge pulse prior to the pulse being applied to the battery cell to alter the magnitude of the charge pulse. The shaping portion may also participate in defining the trailing edge of the pulse, pulse duration, defining a voltage level between pulses, and other functions.

The systems, circuits, and methods disclosed herein are applicable to charging a battery cell and any form of battery that may comprise some number of cells connected in some way to achieve a desired capacity, voltage and output current range for whatever application the battery is being used. The various embodiments discussed herein may also be considered to provide fast charging. In either or both situations, the circuit may be controlled to provide a recharge pulse that includes a shaped rising front edge rather than a sharp edge associated with a conventional square-wave. In one example, the rising front edge of a charge pulse may be based on a determined frequency (harmonic) corresponding to a harmonic associated with a minimum or near minimum real impedance value of the battery cell. The charge pulse may also be based on a combination of the minimum real impedance and imaginary impedance of the cell being charged. In another example, the charge pulse may be based on a conductance and/or susceptance, or any other admittance aspect, either alone or in combination, of the battery cell being charges. Still other aspects of the battery cell may be considered and used to shape a charge pulse. Generally speaking, where real and imaginary impedance values are being considered, the technique assesses harmonic values where the values, alone or in combination, are at a relatively low impedance. With admittance, the techniques assess harmonics where admittance is relatively high of conductance and susceptance alone or in combination.

Discussing, for the moment, a pulse based on the real impedance minimum, the application of the rising front edge corresponding to the near minimum real impedance value may remove inefficient or harmful high harmonic components in the charge signal. Further, a duration of the charge pulse may be controlled by the circuit to maximize or increase the amount of power applied to the battery within the pulse, without exceeding one or more upper thresholds of the magnitude of the charge pulse which may damage battery and thereby affect capacity or longevity among other things. In these manners, a charge signal with shaped pulses may be applied through control of the circuit to deliver an optimized amount of power to the battery in each pulse while, at the same time, removing high frequency, degrading harmonics from the signal. This shaped charge signal may therefore reduce the impedance across the various interface within the battery, including the electrodes, during charge of the battery cell, thereby improving the efficiency and speed of the recharging of the battery cell.

Figure 2:
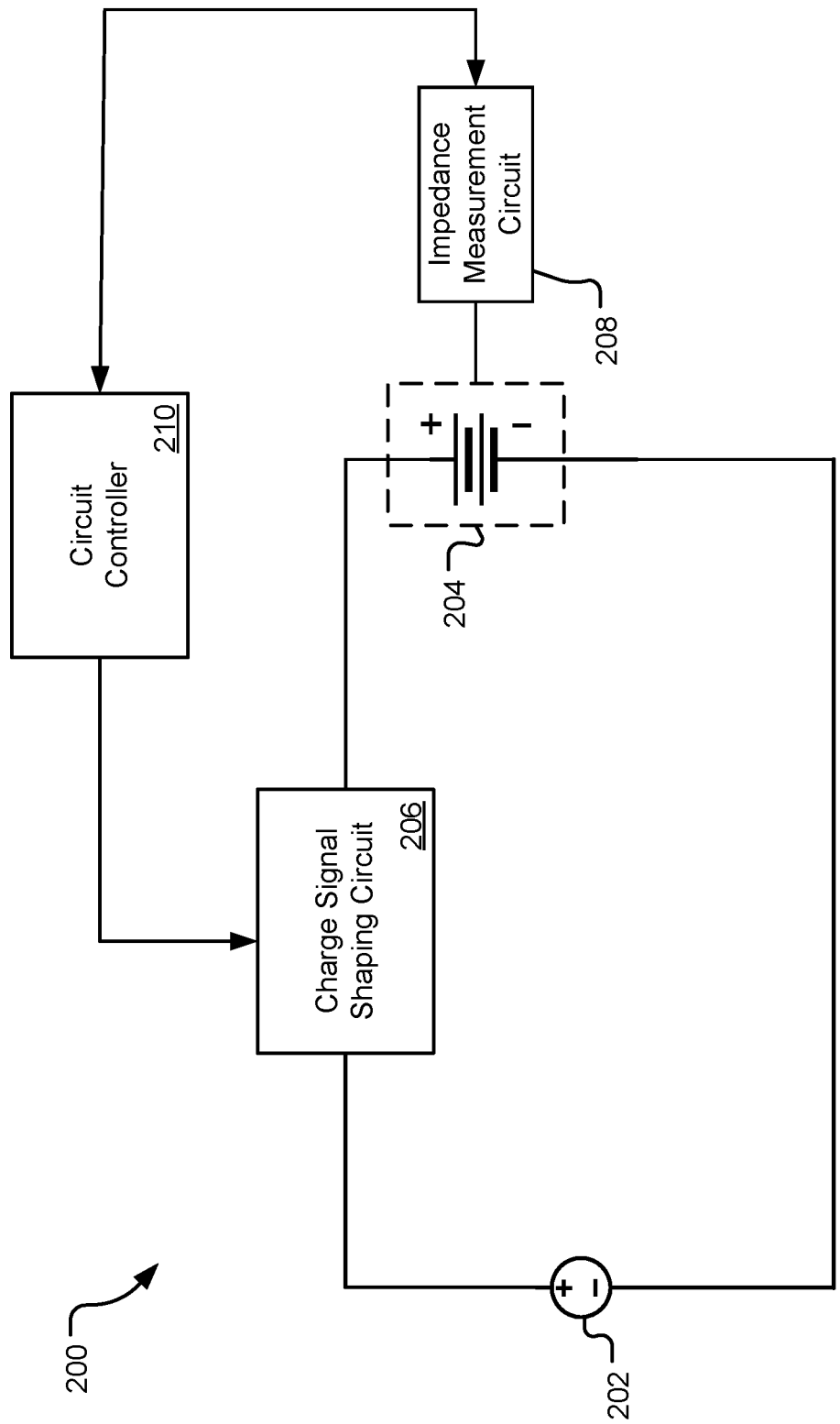
FIG. 2 is a schematic diagram illustrating a circuit for charging a battery utilizing a charge signal shaping circuit in accordance with one embodiment.

FIG. 2 is a schematic diagram illustrating a circuit 200 for recharging a battery cell 204 utilizing a charge pulse shaping circuit 206 and an impedance measurement circuit 208 in accordance with one embodiment. In general, the circuit 200 may include a power source 202, which may be a voltage source or a current source. In one particular embodiment, the power source 202 is a direct current (DC) voltage source, although alternating current (AC) sources are also contemplated. More particularly, the power source 202 may include a DC source providing a unidirectional current, an AC source providing a bidirectional current, or a power source providing a ripple current (such as an AC signal with a DC bias to cause the current to be unidirectional. In general, the power source 202 supplies the charge current that may be shaped and used to charge the battery cell 204. In one particular implementation, the circuit 200 of FIG. 2 may include a charge signal shaping circuit 206 to shape one or more pulses of a charge signal for use in charging the battery cell 204. In one example, a circuit controller 210 may provide one or more inputs to the power signal shaping circuit 206 to control the shaping of the charge signal. The inputs may be used by the shaping circuit 206 to alter a signal from the power source 202 into a more efficient power charging signal for the battery cell 204. The operation and composition of the charge signal shaping circuit 206 is described in more detail below.

In some instances, the charge signal shaping circuit 206 may alter energy from the power source 202 to generate a charge pulse that at least partially corresponds to a harmonic associated with a minimum real impedance value of the battery cell 204. It is also possible to characterize a cell such that impedance may be known at any given charge current, voltage level, charge level, number of charge/discharge cycles, and/or temperature among other factors, such that impedance is not directly measured but instead looked-up from memory, or the like. In one example, the circuit 200 may include an impedance measurement circuit 208 connected to the battery cell 204 to measure cell voltage and charge current, as well as other cell attributes like temperature and measure or calculate the impedance across the electrodes of the cell 204. In one example, impedance may be measured based on the applied pulses. Impedance may also be measured as part of a routine that applies a signal with varying frequency attributes to generate a range of impedance values associated with different frequency attributes of the cell to characterize the cell, which may be done prior to charging, during charging, periodically during charging, and may be used in combination with look-up techniques, and other techniques. The cell impedance may include a real value and an imaginary or reactance value. The impedance of the battery cell 204 may vary based on many physical of chemical features of the cell, including a state of charge and/or a temperature of the cell. As such, the impedance measurement circuit 208 may be controlled by the circuit controller 210 to determine various impedance values of the battery cell 204 during recharging of the cell, among other times, and provide the measured impedance values to the circuit controller 210. In some instances, a real component of the measured impedance of the battery cell 204 may be provided to the charge signal shaping circuit 206 by the circuit controller such that energy from the power source 202 may be sculpted into one or more charge pulses that correspond to a harmonic associated with a minimum real impedance value of the battery cell 204. In another example, the circuit controller 210 may generate one or more control signals based on the received real impedance value and provide those control signals to the charge signal shaping circuit 206. The control signals may, among other functions, shape the charge pulses to include a harmonic component corresponding to the real impedance value. In still other examples, the charge signal shaping circuit 206 may alter energy from the power source 202 to generate a charge pulse that at least partially corresponds to a harmonic associated with a conductance or susceptance component of an admittance of the battery cell 204 or any other aspect related to an impedance at the battery cell. Thus, although described herein as pertaining to a real or imaginary component of impedance, the systems and methods may similarly measure or consider other attributes of the battery cell, such as a conductance component or susceptance component of an admittance of the battery cell.

Figure 3:
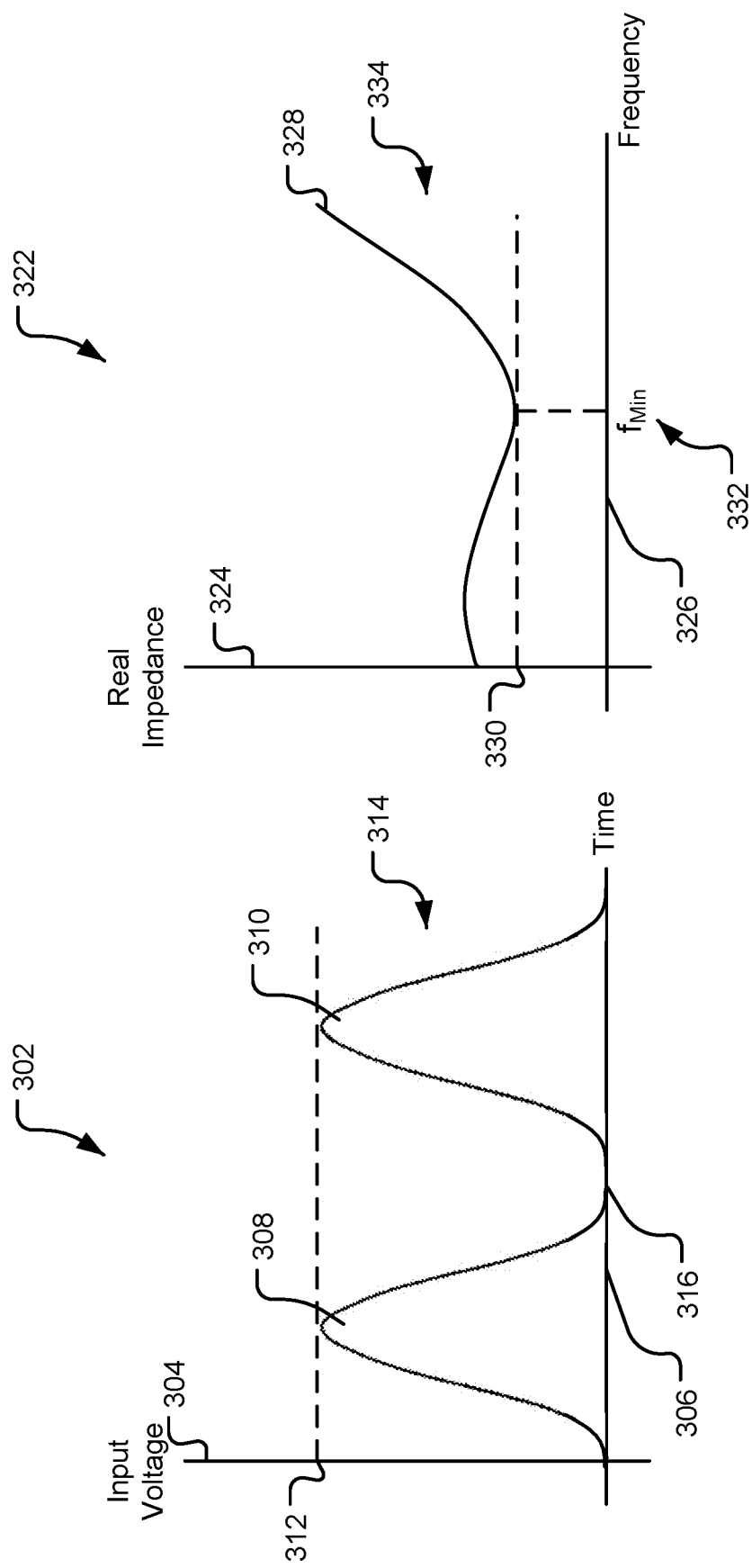
FIG. 3A is a graph of a sinusoidal cell charging signal with a frequency corresponding to a determined minimum real impedance value of a battery cell in accordance with one embodiment.
FIG. 3B is a graph of measured real impedance values of a battery to corresponding frequencies of a charge signal applied to the battery cell in accordance with one embodiment.

FIG. 3A is a graph 302 of an example of a sinusoidal charging signal with a frequency corresponding to a determined minimum real impedance value of a battery cell 204 that may be generated by the circuit 200 of FIG. 2. In this example, the frequency of the sinusoidal signal itself is at a frequency corresponding to the minimum real impedance of the battery cell being charged. More particularly, graph 302 illustrates a plot 314 of an input voltage axis 304 of a charge signal delivered to the battery cell 204 versus a time axis 306. In contrast to the square-wave charge signal discussed above, the charge signal generated by circuit 200 may include a repeating sinusoidal charge signal delivered to the battery cell 204. Only two pulses (pulses 308, 310), are shown in FIG. 3A but it should be recognized that a sequence of such pulses may be delivered to the battery cell over a period of time sufficient to charge the battery cell to some level. The frequency of the sinusoid may, and likely will, vary over time depending on the impedance of the battery cell and the control scheme implemented. As discussed herein, the frequency of a shaped pulses as well as the sinusoid may be set at the minimum impedance or near the minimum impedance, either above or below or both, depending on the implementation. Hence, it is not necessary that the frequency be set strictly at the minimum impedance. The sinusoidal pulses 308, 310 of the charge signal 314 may continue to be generated and transmitted to the battery cell 204 during a recharging operation of the circuit 200. The sinusoidal feature of the charge signal 314 may remove high frequency noise components typically present in a charge signal with a square-wave profile, thereby reducing the impedance at the battery cell 204 and improving the efficiency of the recharge operation. In addition, the charge signal 314 may include a settling or depolarization period 316 of some duration between the pulses 308, 310. The duration of the settling period 316 may be adjustable or controlled by the circuit controller 210 and may be based on various aspects of the recharging operation of the battery cell 204, including but not limited to, a total power provided by a previous pulse 308 of the charge signal 314, a state of charge of the battery cell 204, a measured or estimated temperature of the battery cell 204, a measured impedance of the battery cell 204, and/or the hardware components used in the charge circuit. For example, the duration of the settling period 316 may be based on processing speed of the circuit controller 210 to allow the control circuit 210 adequate time to determine one or more target values for control of the charge circuit 200. The pulses 308, 310 may also include a magnitude below a voltage threshold 312. The voltage threshold 312 may be based on several aspects of the battery cell 204 and/or the power source 202, such as an upper voltage or current threshold of the power source and/or thermodynamic boundaries associated with the voltage, temperature, and current of the battery cell 204. In some instances, the voltage threshold 312 may be controlled by the circuit controller 210, as explained in more detail below.

In one particular instance, a frequency or harmonic of the sinusoidal pulse 308 of the charge signal 314 generated by circuit 200 to recharge the battery cell 204 may be selected and applied to the charge pulse by the circuit controller 210 to minimize the impedance at the battery cell 204. For example, FIG. 3B is a graph 322 of measured real impedance values of a battery cell 204 to corresponding frequencies of a charge signal applied to the battery cell in accordance with one embodiment. In particular, the graph 322 illustrates a plot of real impedance values (axis 324) versus a logarithmic frequency axis (axis 326) of a charge signal. The plot 328 illustrates real impedance values across the electrodes of a battery cell 204 at the various frequencies of a sinusoidal charge signal. As shown, the real impedance values 328 may vary based on the frequency of the charge signal, with a general rapid increase in real impedance values 328 at the highest frequencies. The plot 334 of real impedance values for the battery cell 204, however, also indicates a minimum real impedance value 330 that corresponds to a particular charge signal frequency, labeled as $f_{Min}$. The plot of real impedance values 334 for the battery cell 204 may be dependent on many factors of the cell, such as battery chemistry, state of charge, temperature, composition of charge signal, and the like. Thus, the frequency $f_{Min}$ 332 corresponding to the minimum real impedance value 330 of the battery cell 204 may similarly be dependent upon the characteristics of the particular battery cell 204 under charge. The frequency $f_{Min}$ 332 may correspond to other aspects of the battery cell 204, such as the configuration of the cells in a pack and the connections between the cells in the pack.

As the impedance of the battery cell 204 may convert received power to heat or other inefficiencies, generating a sinusoidal charge pulse 308, 310 at or near the frequency 332 corresponding to the minimum real impedance value 330 for the battery cell 204 may improve the efficiency of energy application to the battery cell 204 for charging. In other words, shaping the pulses 308, 310 of the charge signal 314 to include harmonics at or near the frequency $f_{Min}$332 may increase the efficiency of the charge signal 314 to the battery cell 204 by reducing the wasted energy converted to heat due the impedance of the battery cell 204. As such, one implementation of the recharge circuit 200 of FIG. 2 may include the impedance measurement circuit 208 connected to the battery cell 204 to determine various real impedance values of the battery cell over a range of frequencies of the charge signal. The impedance measurement circuit 208 may include any known or hereafter circuit configured to measure impedance across the electrodes of the battery cell 204, including a voltage sensor and current sensor. Multiple impedance values of the battery cell 204 may be measured at various frequencies of a charge power signal and provided to the circuit controller 210 which may, in turn, determine or estimate the minimum real impedance value of the curve 334 of the battery cell 204. The circuit controller 210 may also control one or more components of the charge signal shaping circuit 206 to generate a series of sinusoidal charge pulses 308, 310 at a harmonic of the frequency $f_{Min}$ 332 corresponding to the minimum real impedance 330 value of the battery cell 204. As further explained below, the circuit controller 210 may also conduct an iterative process of measuring or otherwise determining an estimated real impedance value for a current state of the battery cell 204 at various times during a recharge session and adjust the pulses 308, 310 of the charge power signal 314 accordingly to coincide with the new estimated frequency $f_{Min}$ 332. By controlling the circuit 200 to generate a charge signal 314 with a harmonic frequency for the pulses 308, 310 based on the determined or estimated minimum real impedance value, the energy of the charge signal 314 may be more efficiently applied to recharge the battery cell 204 while minimizing the wasted energy from high impedances at the electrodes due to high frequency portions of the charge signal.

Figure 4:
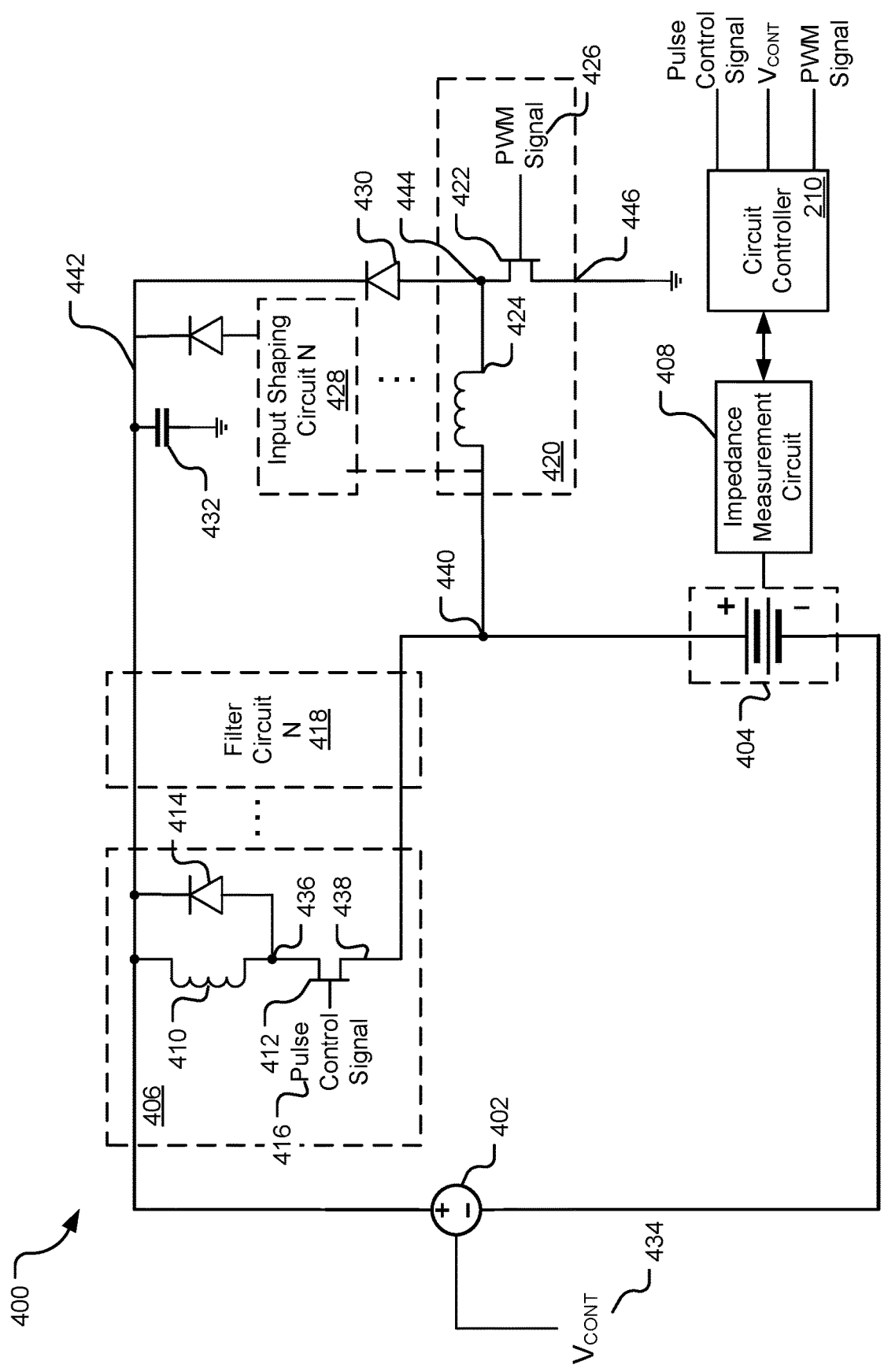
FIG. 4 is a schematic diagram illustrating a circuit for shaping a charge signal for a battery based on a frequency corresponding to a minimum impedance value in accordance with one embodiment.

One particular implementation of the circuit for charging a battery cell utilizing charge pulse shaping is illustrated in FIG. 4. The circuit 400 may be controlled by a controller 210 to shape a recharging signal for a battery cell based on a frequency $f_{Min}$ corresponding to a minimum impedance value. In one example, the controller 210 may be a feedback control system using either a voltage or current amplifier. In general, the controller 210 may be an analog controller, a digital controller, a micro-controller or micro-processor, or a customized integrated circuit, such as an application specific integrated circuit (ASIC). The controller 210 may be configured or programmed to perform one or more of the operations discussed herein to control the performance of the shaping circuit 400. Further, as discussed below, the circuit 400 may also consider the imaginary component of impedance, the conductance component of admittance, a susceptance component of admittance, or any combination thereof. More or fewer components may be included in the circuit 400 and components may be replaced by other components of equal function. In some implementations, some components may be replicated in parallel to charge multiple cells in parallel or to provide greater charge capacity to a given cell or arrangement of cells. The circuit 400 of FIG. 4 is but one example of a power signal shaping circuit that may be controlled to provide the harmonic sinusoidal charge signal discussed herein.

The circuit 400 may include a power source 402 coupled to a rail 442 to provide the charge signal to the battery cell 404. The power source 402 may be any type of energy source, including a DC voltage source, an AC voltage source, a current source, and the like. In some implementations, the power source 402 may be controlled via an input (such as $V_{CONT}$ 434) to vary the magnitudes of the energy waveforms or pulses provided to the circuit 400. For example, circuit controller 210 may provide a control signal $V_{CONT}$ 434 to the power source 402 to turn on the power source, select a magnitude of the power signal, select between a DC power signal and an AC power signal, and the like. In one particular example, the power source 402 may be configured to adjust the magnitude of the provided charge signal based on a voltage value of the received $V_{CONT}$ 434 signal.

A filter circuit 406 may be connected to the power rail 442 to receive power generated by the power source 402. The filter circuit 406 may include components that, in general, output a charge signal to battery cell 404 with portions corresponding to a frequency $f_{Min}$ 322. For example, the output signal from the filter circuit 406 may include a leading edge at a harmonic at or near the frequency $f_{Min}$ 322 corresponding to the minimum real impedance value determined above. In some instances, the components of the filter circuit 406 are controllable via one or more pulse control signals 416 transmitted by the circuit controller 210 to the filter circuit. In the particular example shown in FIG. 4, the filter circuit 406 may include a first inductor 410 connected in series between the power rail 442 and a first transistor 412. The inductor value of the first inductor 410 will affect the shape of the leading edge of the pulse such that selection of the inductor value may depend on the charge characteristics of the battery cell 404, among other things. The first transistor 412 may also be connected to a first electrode of the battery cell 404. The first transistor 412 may receive an input signal, such as pulse control signal 416, to operate the first transistor 412 as a switching device or component. In general, the first transistor 412 may be any type of FET transistor or any type of controllable switch for connecting the first inductor 410 to the first electrode 440 of the battery cell 404. For example, the first transistor 412 may be a FET transistor with a drain 412 connected to the first inductor 410, a source connected to the battery cell 404, and a gate receiving the pulse control signal 416. In one implementation, the pulse control signal 416 may be provided by the circuit controller 210 to control the operation of the first transistor 412 as a switch that, when closed, connects node 436 to the first electrode of battery cell 404 and, when open, breaks the connection between the inductor 410 and the battery cell 404. Control of the first transistor 412 to generate a charge pulse is described in more detail below with reference to the method 500 of FIG. 5.

The first inductor 410 may operate generally to prevent a rapid increase in current transmitted to the battery cell 404 upon connection to the battery cell via first transistor 412. More particularly, the first inductor 410 may resist a rapid conduction of current through the inductor and to the battery cell 404 (when the first transistor 412 is conducting). This resistance to a rapid increase in current may prevent a steep front edge to the pulses of the charge signal provided by the power rail 442, thereby reducing the high frequency harmonics that may occur at the battery cell 404 at the application of a square-wave input. Upon conducting in response to a signal on the pulse control signal input 416 to the transistor 412, a current or other form of an energy flux from the power rail 442 may be provided via the first inductor 410 and first transistor 412 to the battery cell 404 for charging the battery cell 404 while minimizing the high frequency noise effects. The filter circuit 406 may also include, in some instances, a flyback diode 414 connected in parallel to the first inductor 410. The flyback diode 414 provides a return path for the energy flux provided by the power rail 442 when the first transistor switch 412 is open or not conducting. For example, the first transistor 412 may be controlled, via the pulse control signal 416, to cease conduction of the current of the power rail 442 to the battery electrode 440. The current may then be routed via the flyback diode 414 back to the upper rail 442. A storage capacitor 432 may also be connected between the upper rail 442 and ground or common such that current provided by the power rail 442 and returned via the flyback diode 414 may be provided to the storage capacitor 432 via the upper rail 442 during periods in which the first transistor 412 is open. As explained in more detail below, the energy stored in the storage capacitor 432 may be returned to the upper rail 442 and the input of the filter circuit 406 upon closing of the first transistor 412 (such as at the next pulse of the charge signal) such that energy is not lost in the circuit during periods in which the first transistor 412 is open, further improving the efficiency of the circuit 400.

Although the components of a single filter circuit 406 are illustrated in FIG. 4, additional filter circuits with the same or similar configurations may be connected in parallel to filter circuit 406. For example, filter circuit 406 and any number of additional filter circuits, up to filter circuit N 418, may be connected in parallel in the charge circuit 400. Each filter circuit 406, 418 may be independently controlled by the circuit controller 210 via individual pulse control signals 406 to filter out one or more harmonics from the current provided to charge the battery cell 404. In another example, more than one filter circuit 406 may be controlled by the same pulse control signal 416. One or more of the additional filter circuits 418 may include similar components of the same or different values. For example, a first inductor of filter circuit N 418 may have a higher inductance value than the first inductor 410 of filter circuit 406. In general, a higher inductance value of the first inductor 410 provides more resistance to a rapid change in charge pulse thereby forming a ramped leading edge of the charge pulse relative to an inductor of a lesser value. In this manner, the circuit controller 210 may control the various filter circuits 406, 418 to shape the leading edge of the energy pulse provided to the battery cell 404 via the various inductance values of the selected first inductors 410.

To further alter a pulse of the charge signal provided to the battery cell 404, one or more input shaping circuits 420 may be connected at the first electrode 440 (e.g., anode or positive terminal) of the battery cell 404. In particular, input shaping circuit 420 may include a second inductor 424 connected between the first electrode 440 of the battery cell 404 and a second transistor 422. In one example, the second transistor 422 may be a FET transistor with a drain 444 connected to the second inductor 424, a source 446 connected to ground or common, and a gate receiving a control signal 426. Similar to the first transistor 412, the second transistor 422 may operate as a switch connecting the source 444 to the drain 446 connected to a negative rail, a ground, or common. The second transistor 422 may be controlled by an input control signal 426. In one implementation, the shaping input signal 426 may be a high frequency pulse-width modified (PWM) signal that alternates between an on state and an off state at a high frequency. In one example, the PWM signal 426 may operate at a frequency above 100 kHz, although the PWM signal 426 may operate at any frequency. In response to the high frequency switching PWM signal 426, the second transistor 422 may rapidly alternate between a conducting state (or "on" state) and a non-conducting (or "off" state). The operation of the second transistor 422 in this manner may cause the shaping circuit 420 to siphon energy from charge pulses transmitted to the battery cell 404 toward ground. The siphoned current may be stored in the second inductor 424 and, as the current in the inductor lags behind the voltage, the current does not flow to ground while it builds up in the second inductor 424. However, the off portion of the PWM signal 426 may close the transistor 422 rapidly enough that, once the current leaves the second inductor 424, the transistor 422 is off and little or none of the siphoned energy signal from the charge pulse is transmitted to ground via connection 446. Rather, the siphoned energy may be transmitted via flyback diode 430 to the upper rail 442 and stored in the storage capacitor 432 for reuse by the charging circuit 400.

By siphoning energy from the charge signal, the input shaping circuit 420 may alter portions of the magnitude of the charge pulse to shape or sculpt the pulse to the battery 404. In particular, control of the frequency of the PWM signal 426 may siphon more or less energy from the charge signal. Further, a duty cycle of the PWM signal 426 may be selected or controlled to correspond to a duration of the alteration or shaping of the charge pulse. In this manner, the PWM signal 426, in some instances provided by the circuit controller 210, may alter the charge signal to the battery cell 404 from filter circuit 406. Also, similar to the filter circuit 406, one or more additional input shaping circuits 428 may be connected in parallel to the input shaping circuit 420. Each input shaping circuit 420, 428 may be independently controlled by the circuit controller 210 via individual PWM control signals 426. In another example, more than one shaping circuit 420 may be controlled by the same PWM control signal 426. One or more of the additional input shaping circuits 428 may also include similar components of the same or different values. For example, an input second inductor of shaping circuit N 428 may have a higher or lower inductance value than the input second inductor 424 of filter circuit 420. Through the control of the pulse control signal 416 and the PWM signal 426 applied to the filter circuit 406 and/or the input shaping circuit 420, one or more pulses of the charge signal applied to the battery cell 404 may be shaped to achieve a harmonic charge signal. Additional shaping of the input charge signal may also be controlled via the circuit controller 210 to further sculpt the profile of the signal pulses, as described in more detail below. In addition, the various control signals of the circuit controller 210 may be used to control aspects of the charge signal provided to the battery cell 404. For example, the control signals may control the voltage at the battery cell 404, the current provided to the battery cell, or the overall energy or power provided to the battery cell. Thus, although discussed herein as controlling or shaping a charge signal to the battery cell, it should be appreciated any aspect of the charge signal may be controlled by the circuit controller 210.

The circuit 400 of FIG. 4 may also include an impedance measurement circuit 408 connected to the battery cell 404. In general, the impedance measurement circuit 408 measures the impedance characteristics seen at the electrodes of the battery cell 404. In one example, the impedance measurement circuit 408 may include a voltage sensor measuring the voltage across the electrodes of the battery cell 404 and a current sensor measuring the current into the battery cell. The impedance measurement circuit 408 may include, however, any known or hereafter developed circuit to measure impedance of a battery cell 404. Further, the impedance measurement circuit 408 may be controlled by the circuit controller 210 to measure the cell impedance at various times or intervals. For example, the impedance measurement circuit 408 may be configured to measure the impedance of the battery cell 404 during a testing period in which a charge signal is applied to the battery cell 404 over a range of frequencies. These measurements may be obtained and provided to the circuit controller 210 to determine a minimum real impedance for the battery cell 404 as discussed above with relation to the graph 322 of FIG. 3B.

Figure 5:
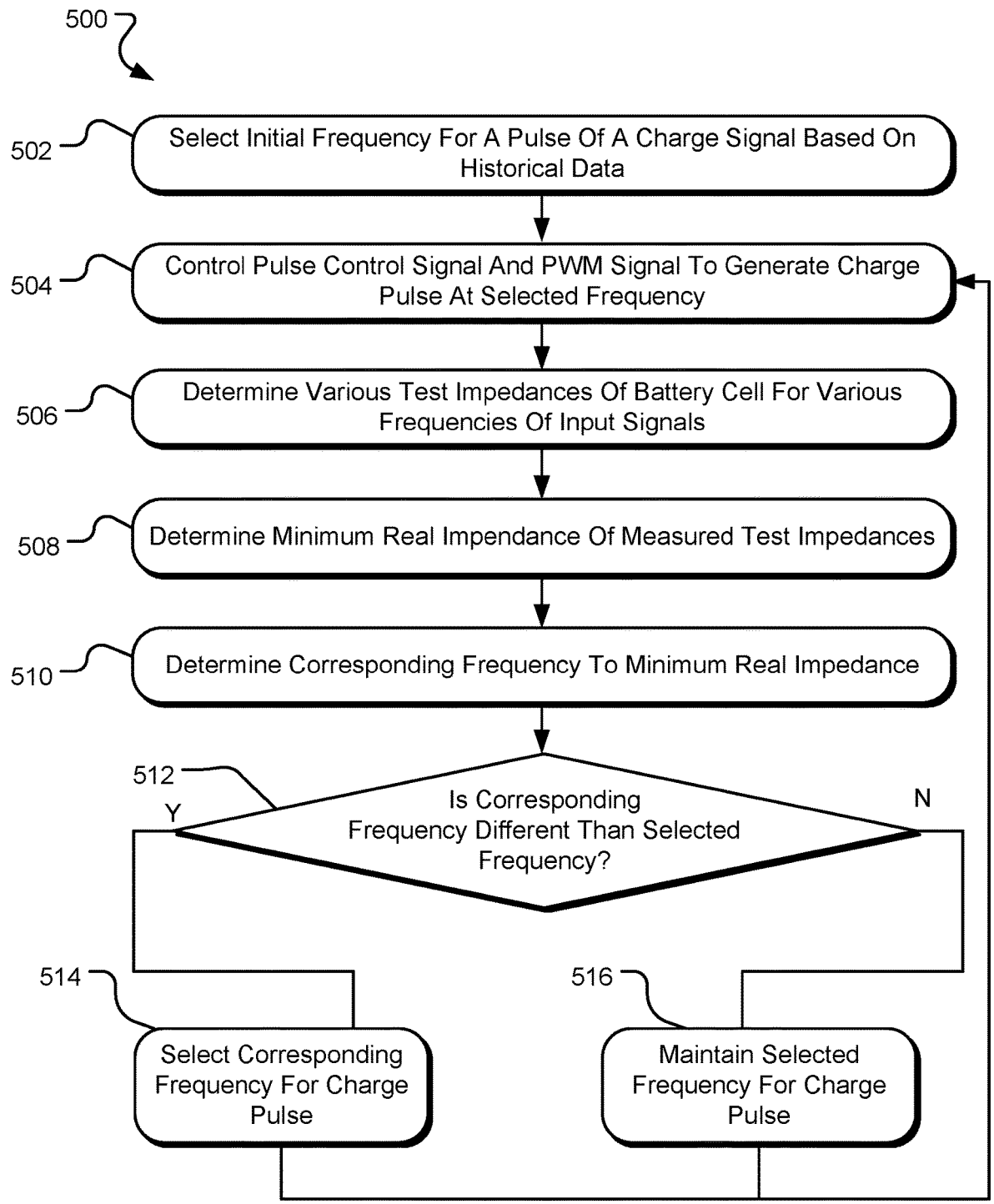
FIG. 5 is a flowchart illustrating a method for generating a charge signal for a battery based on a frequency corresponding to a minimum impedance value in accordance with one embodiment.

The circuit controller 210 may utilize the circuit 400 of FIG. 4 to shape pulses of a charge signal for a battery cell based on a frequency corresponding to a minimum impedance value. In particular, FIG. 5 illustrates a method 500 for generating a charge signal for a battery cell based on a frequency corresponding to a minimum impedance value in accordance with one embodiment. The operations of the method 500 may be performed by a circuit controller 210 and, in particular, by providing control signals to the power source 402, the filter circuit 406, and/or the input shaping circuit 420 to control the various components of the circuit 400. Other circuit designs and components may also be controlled by the circuit controller 210 to perform one or more of the operations of the method 500. Thus, although described herein in relation to the circuit 400 of FIG. 4, the operations of the method 500 may be executed through any number of hardware components, software programs, or combinations of hardware and software components.

Beginning in operation 502, the circuit controller 210 may select an initial frequency for a charge pulse to be used to recharge the battery cell 404. For example, a sinusoidal charge pulse may be selected to recharge a battery cell 404 to avoid the inefficiencies of a square-wave charge pulse. An initial frequency of the charge pulse may be selected by the circuit controller 210. In some instances, the selected frequency may be determined to minimize or reduce the real impedance at the battery cell 404 during the initial charging of the battery. Initially, the real impedance of the battery cell 404 may not be known by the circuit controller 210 as a charge signal has not yet been applied to the battery and one or more characteristics (such as a state of charge of the battery cell or other electrochemical aspects of the battery) may not be known. Thus, the circuit controller 210 may select an initial frequency for the charge pulse to begin providing energy to the battery cell 404. In one particular implementation, the circuit controller 210 may obtain the initial frequency for the charge pulse based on historical data of the battery cell 404, historical data of other battery cells, historical data of the circuit controller 210, or other battery recharge data. For example, the circuit controller 210 may analyze previous recharging sessions of the battery cell 404 or other battery cells. Based on the analysis, the circuit controller 210 may estimate a frequency $f_{Min}$ for the battery cell 404 at which the real impedance value of the battery cell is at a minimum. As more and more recharging sessions are analyzed, a best estimation for an initial frequency for the charge pulse may be determined that corresponds to an estimated minimum real impedance value for the battery cell 404. The initial selected frequency may not correspond to an actual minimum real impedance value for a state of charge for the battery cell 404, but may rather be based on one or more historical real impedance measurements for the target battery cell or any other battery cells.

With the initial frequency for the charge pulse selected, the circuit controller 210 may control the pulse control signal input 416 and/or the PWM signal input 426 of the charge circuit 400 to generate a harmonic charge pulse for the battery cell 404. In particular, the circuit controller 210 may provide a pulse control signal 416 to activate a first transistor 412 for a first period of time. The activation of the first transistor 412 may conduct an energy pulse from the power rail 422 to the battery cell 404. A first inductor 410 of the filter circuit 406 may resist a rapid increase in the pulse (e.g., a square-wave pulse) received from the power rail 422 and output an angled leading edge (e.g., a leading edge of the sinusoidal pulse) for transmission to the battery cell 404. The duration of the charge signal pulse may also correspond to the first period of time in which the first transistor 412 is activated and conducting. Further, the magnitude of the pulse may correspond to the magnitude of the signal provided by power source 402 (potentially controlled by $V_{CONT}$ 434) and/or the duration of the pulse signal as controlled via the pulse control signal 416. In particular, the duration for which the first transistor 412 is conducting corresponds to the duration of the energy pulse provided to the battery cell 404. In many instances, the circuit control 210 may repeat the activation/deactivation control of the first transistor 412 to provide a periodic, repeating pattern of energy pulses to the battery cell 404.

In addition to the leading edge and the pulse duration, alterations to the energy pulse provided to the battery cell 404 may be performed through control of the input shaping circuit 420. In particular, a PWM signal 426 may be provided to the second transistor 422 to rapidly activate and deactivate the transistor to cause the input shaping circuit 420 to siphon energy from the pulse and reduce the magnitude of the pulse at any time during the duration of the pulse. A frequency of the PWM signal 426 may control how much energy is siphoned from the energy pulse signal, further altering the profile. Through precise control of the PWM signal 426, the pulse magnitude may decrease (through the removal of energy from the pulse) or increase (by deactivating the transistor 422 such that no energy is removed from the pulse by the input shaping circuit 420) to generate a shaped pulse for charging the battery cell 404.

Through the control of the inputs to the circuit 400, such as the pulse control signal 416 and/or the PWM signal 426, the circuit controller 210 may create a sinusoidal pulse for charging the battery cell 404 at the selected initial frequency, similar to the waveform 314 of FIG. 3A. However, as mentioned above, the minimum real impedance at the battery cell 404 may vary during the charging of the battery. For example, the state of charge and the temperature of the battery cell 404 may alter minimum real impedance characteristics. Adjusting the frequency of the pulse charge signal to a frequency corresponding to a minimum real impedance of the battery cell 404 at the current state of the battery may provide efficiency benefits to charging the battery. Therefore, the circuit controller 210 may, in operation 506, measure the impedance of the battery cell at various frequencies to obtain a function of real impedance values of the battery cell at the various frequencies. In one implementation, the circuit controller 210 may apply one or more test signals at various frequencies to the battery cell 404 to determine a charge signal frequency corresponding to a measured minimum real impedance at the battery cell 404. The frequencies of the test signals may be predetermined by the circuit controller 210 to provide a range of test signals to the battery cell 404. For each test signal, a corresponding real impedance value at the battery cell 404 may be determined and/or stored. In addition to using many frequencies, a Galvanostatic Intermittent Titration Technique (GITT) may also be used. In general, GITT uses the properties of a square pulse (being the sum of sinusoidal frequencies over a spectrum) to expose a complex impedance that may be used to determine the impedance of the battery cell 404.

In operation 508, a minimum real impedance value of the measured test impedances may be determined. For example, the circuit controller 210 may select the smallest real impedance value from the received test results as the minimum impedance value. In another example, circuit controller 210 may analyze the received real impedance values and extrapolate the values to determine a minimum real impedance value. For example, the measurement values may indicate that the real impedance values are decreasing for a series of increasing test frequencies, followed by the measurement values increasing for a next series of increasing test frequencies. The circuit controller 210 may determine that a minimum real impedance value for the battery cell 404 corresponds to a frequency between the first set of increase test frequencies and the second set of increasing test frequencies. In this circumstance, the circuit controller 210 may estimate a minimum real impedance value for the battery cell 404 between the measured values. In operation 510, the circuit controller 210 may determine a corresponding frequency to the determined minimum real impedance value for the battery cell 404. For example, a graph 334 of real impedance values 324 of the battery cell 404 to frequencies 326 of the test signals may be generated and a minimum real impedance value 330 may be determined from the graph. A corresponding frequency to the minimum real impedance value 330 may also be determined from the graph 334. In general, any correlating algorithm for determining a frequency of an input signal to a battery cell 404 resulting in a minimum real impedance value may be utilized to determine the corresponding frequency.

In operation 512, the circuit controller 210 may determine if the frequency corresponding to the minimum real impedance value of the measured test impedances is different than the previously selected frequency at which the charge pulse is provided. If the circuit controller 210 determines that the corresponding frequency obtained from application of the test signals to the battery cell 404 is different than the frequency at which the charge pulse is being provided, the circuit controller 210 may select the corresponding frequency for additional pulses of the charge signal in operation 514. Further, the circuit controller 210 may return to operation 504 and generate and provide input signals to the shaping circuit to adjust the frequency of the charge pulse for the battery cell to the determined corresponding frequency. If the corresponding frequency is not different than the frequency at which the charge pulse is being provided, the circuit controller 210 may maintain the frequency for additional charge pulses in operation 514 and provide corresponding control signals to the shaping circuit in operation 504. Thus, through the method 500 of FIG. 5, a frequency corresponding to a minimum real impedance value for a battery cell may be selected for sinusoidal charge pulses generated for recharging the battery cell 204.

Figure 6:
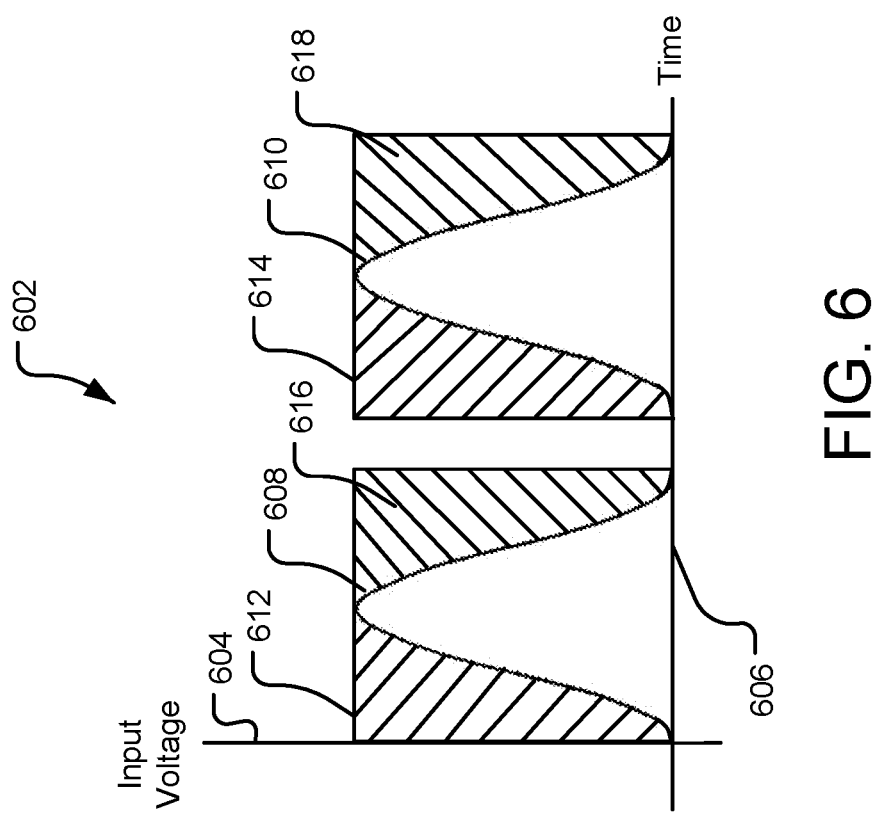
FIG. 6 is a graph of superimposed square-wave pulses and sinusoidal pulses of a battery charge signal in accordance with one embodiment.

One potential disadvantage in using a sinusoidal charge signal is that such a signal may provide less power to the battery cell for recharging in comparison to a square-wave charge signal. This potential disadvantage may be particularly pronounced in fast charge circumstances that try to provide the greatest amount of energy to the battery cell in the least amount of time. The graph 602 of FIG. 6 provides an illustration of this potential disadvantage. In particular, FIG. 6 is a graph 602 of input voltage values 604 of superimposed square-wave pulses 612, 614 and sinusoidal pulses 608, 610 of a battery charge signal over time 606. In general, the area under each pulse indicates the amount of charge that might be provided to the battery for recharging. It should be recognized that the area under the pulse represents the amount of charge available—as discussed above, there are attributes of batteries and charging generally that interfere with the ability of all of the energy of a square pulse from being delivered to charge the cell. Nonetheless, the difference between the amount of charge provided through square-wave pules 612, 614 and the sine-wave pulses 608, 610 is illustrated in the hashed areas 616, 618. As shown, the sinusoidal pulses 608, 610, while reducing the impedance at the battery due to estimating the selected harmonic frequency discussed above, may provide less charge to the battery per pulse than the square-wave pulses 612, 614. Minimum impedance frequency based charging may thus improve charging relative to other systems; however, further improvements and optimizations may also be available.

One potential method for providing similar charge amounts to the battery at the selected harmonic corresponding to a minimum real impedance value is to increase the magnitude of the charge pulse 608, 610. However, many batteries include characteristics that impose upper thresholds on the magnitude of a charging signal such that merely increasing the magnitude of the sinusoidal pulses may not be beneficial for fast charging the battery cell. For example, the electrolytes of many batteries begin to breakdown at a particular power level correlated with voltage thresholds, reducing the life of the battery due to the irreversibility of such chemical reactions. Such breakdown of the electrolyte may also occur at abrupt changes in a recharge power signal applied to the electrodes of the battery. Other components of the battery may also breakdown or otherwise suffer damage to abrupt application of a power recharge signal. For example, one or more permanent channels may form across the solid electrolyte interphase (SEI) layer of a lithium ion battery due to the high power signal, resulting in permanent spatial inhomogeneities across the anode. The SEI layer may also increase in thickness in response to the high power signal, reducing the efficiency of the battery. Further, increasing the magnitude of the recharge power signal may cause the battery to generate heat faster than it can be dissipated, potentially resulting in damage to the battery and higher risk of thermal runaway. As such, simply increasing the magnitude of the pulses 608, 610 to provide additional charge may damage the battery under recharge.

Figure 7:
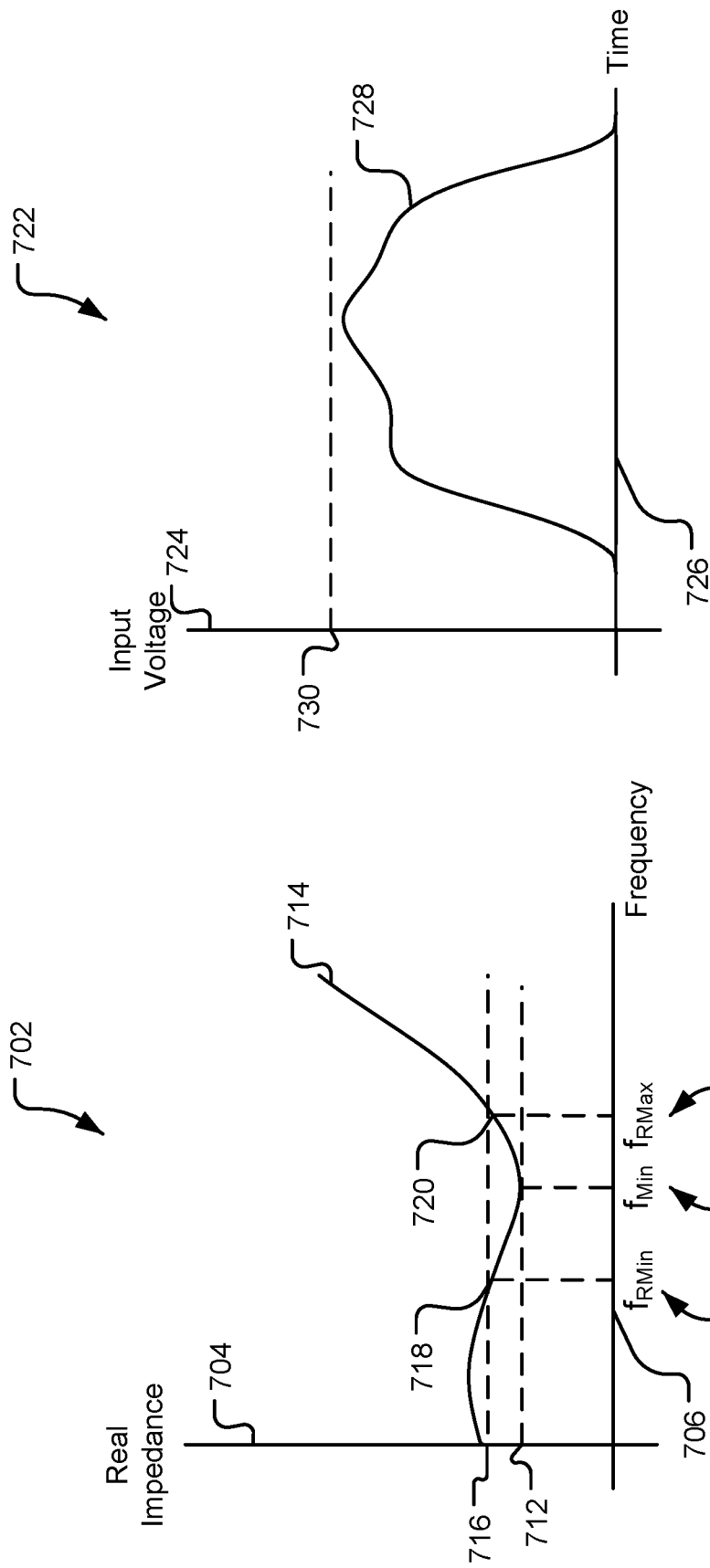
FIG. 7A is a graph of a measured real impedance values of a battery to corresponding frequencies of a charge signal applied to the battery with an indicated maximum and minimum frequency in accordance with one embodiment.
FIG. 7B is a signal diagram of a shaped battery charge pulse with a plurality of frequencies corresponding to maximum and minimum frequency real impedance values within a range of acceptable values based upon exhibited impedance of a battery cell in accordance with one embodiment.

An alternate method to increase the charge provided from a sinusoidal pulse 608, 610 is to combine harmonics and widen the peak and/or tune the leading edge of the pulse to the target real impedance minimum frequency (and/or target imaginary impedance as discussed further below) while maintaining the pulse at or near the pulse peak where the sine pulse would normally start reducing. In one example, the methods and circuits discussed herein may be applied to determining a range of frequencies corresponding to one or more minimum real impedance values of the battery cell and provide a charge signal to the battery cell including harmonics within the range of identified frequencies. For example, FIG. 7A is a graph 702 of measured real impedance values 714 of a battery cell to corresponding frequencies 706 of a charge signal applied to the battery cell. It should be recognized that the values may be measured in real-time, but may also be measured and stored and hence not measured in real-time, they may be characterized or derived from other information, they may be measured but only periodically, a frequency may be set to some initial value and then adjusted in a feedback loop, and the like. It should also be appreciated that other aspects of the battery cell may similarly be measured or estimated and used to shape a charge pulse, such as imaginary impedance values, admittance values, and/or susceptance values. The graph illustrates a maximum frequency 710 and a minimum frequency 708 ranging between acceptable, minimal impedance values, albeit not strictly at the minimum impedance frequency value. The graph 702 of FIG. 7A is similar to graph 322 of FIG. 3B discussed above in that it represents a plot of real impedance values of a battery cell versus a frequency of a charge signal provided to the battery. However, in this example, rather than determining a frequency $f_{Min}$ 332 corresponding to a minimum real impedance value 330, a range of frequencies defined by a minimum frequency $f_{RMin}$ 708 and a maximum frequency $f_{RMax}$ 710 may be determined near the minimum real impedance value 712 of the battery based on a range of acceptable impedance values for charging the battery cell. The minimum frequency $f_{RMin}$ 708 and maximum frequency $f_{RMax}$ 710 may be selected and included in a generated battery charge signal pulse to widen the profile of the pulse and increase the charge sent to the battery cell during each pulse. Through the inclusion of multiple harmonics in the charge pulse of the power recharge signal based on the range of frequencies at the acceptable impedance values, more charge than available from a single harmonic sine-wave may be provided to recharge a battery cell while maintaining a smaller impedance at the battery cell receiving the charge pulse.

FIG. 7B is a signal diagram 722 of a battery cell charging pulse including a plurality of frequencies corresponding to a maximum frequency $f_{RMax}$ 710 and minimum frequency $f_{RMin}$ 708 based on real impedance values of a battery cell in accordance with one embodiment. The signal diagram 722 illustrates input voltages 724 versus time 726, including a maximum voltage threshold 730 above which damage to a battery may occur. In particular, the charge pulse 728 of the diagram 722 may be generated based on the range of frequencies indicated in the graph 702 of FIG. 7A. For example, the charge pulse 728 of FIG. 7B may include a range of harmonics that lie between the minimum frequency $f_{RMin}$ 708 and the maximum frequency $f_{RMax}$ 710. In one instance, the minimum frequency $f_{RMin}$ 708 and the maximum frequency $f_{RMax}$ 710 may be based on a range around a determined minimum real impedance value 712 for the battery cell such that a frequency $f_{Min}$ 711 corresponding to a minimum real impedance value 712 may be within the minimum frequency $f_{RMin}$ 708 and the maximum frequency $f_{RMax}$ 710. At each selected harmonic frequency within the charge pulse 728, a corresponding magnitude may be determined based on the corresponding real impedance value of the battery at that frequency, resulting in a somewhat non-uniform charge pulse. However, none of the selected magnitudes may exceed an upper voltage or power threshold 730 at which the battery cell under recharge may be damaged or cause a thermal runaway of the battery. Through the inclusion of a range of frequencies corresponding to a minimum real impedance value 712, the charge pulse may be expanded such that more charge may be applied to recharge the battery, while maintaining a low impedance at the battery. In this manner, a high charge, low impedance charge signal may be used to recharge the battery cell that improves the efficiency in comparison to a square-wave recharge signal.

Figure 8:
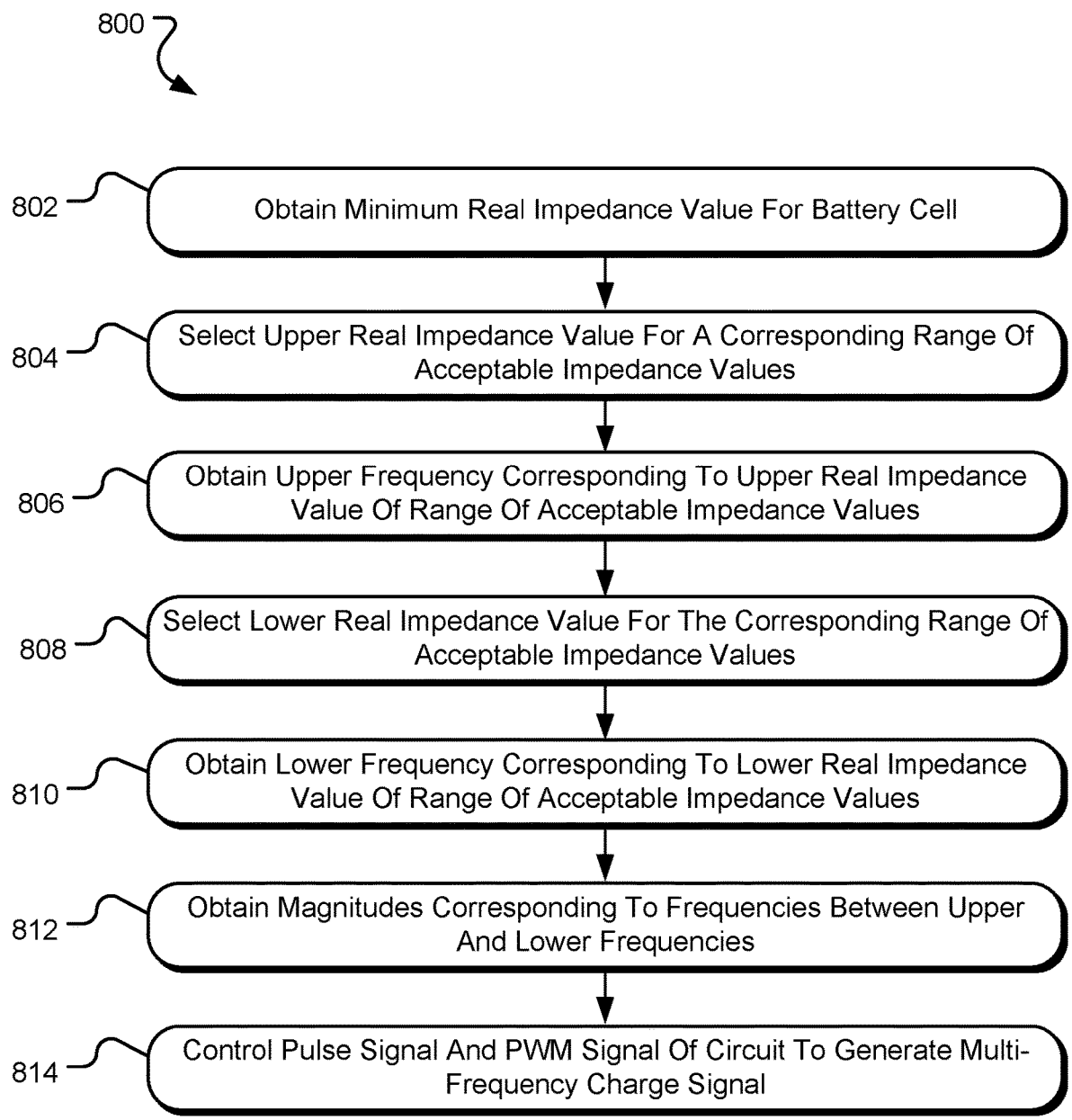
FIG. 8 is a flowchart illustrating a method for generating a charge signal for a battery based on a range of frequencies corresponding to a maximum and minimum real impedance values of the battery cell in accordance with one embodiment.

FIG. 8 is a flowchart illustrating a method for generating a charge signal for a battery cell based on a range of frequencies corresponding to maximum and minimum real impedance values of the battery in accordance with one embodiment. As noted above, a similar method may be executed to generate a charge signal for a battery cell based on other aspects of the battery cell, such as imaginary impedance values, admittance values, and/or susceptance values. Similar to the method 500 of FIG. 5, the operations of the method 800 of FIG. 8 may be performed by a circuit controller 210 and, in particular, by providing control signals to the power source 402, filter circuit 406, and/or the input shaping circuit 420 to control the various components of the circuit 400 of FIG. 4. Other circuit designs and components may also be controlled by the circuit controller 210 to perform one or more of the operations of the method 500. Thus, although described herein in relation to the circuit 400 of FIG. 4, the operations of the method 500 may be executed through any number of hardware components, software programs, or combinations of hardware and software components.

Beginning in operation 802, the circuit controller 210 may obtain a minimum real impedance value for the battery cell. Obtaining the minimum real impedance value may be similar to above in that the circuit controller 210 may measure or receive an impedance measurement of the battery at various frequencies of a charge signal. The minimum real impedance value may also be determined through a looped or circuit controller 210 driven process. For example, the circuit controller 210 may cause the circuit to charge the battery at different frequencies, e.g., a range of frequencies, and measure impedance of the battery cell 204 until a minimum impedance value for the battery cell is found. Such measurements may be done during active charging of a battery cell or maybe done and stored in memory and operated in a look-up fashion. For some batteries, the impedance measurements versus a charge signal frequency may be similar to the graph 702 of FIG. 7A. Similar to the graph 702, the circuit controller 210 may determine a minimum real impedance value 712 of the battery cell based on the plurality of impedance measurements. The impedance measurement process may also obtain and store impedance values at different frequencies, e.g., obtain impedance measurements at frequencies greater and less than the frequency $f_{Min}$ 711 at which the minimum frequency occurs.

In operation 804, the circuit controller 210 may select an upper real impedance value 720 value for a corresponding range of acceptable impedance values. In particular, the circuit controller 210 may determine or be provided with an acceptable impedance value 716 at the battery cell based on the application of the charge signal. The acceptable impedance value 716 is shown and described as one acceptable impedance value, above the minimum impedance value, and which occurs at a frequency both below and above the frequency $f_{Min}$ 711 at which the minimum impedance occurs. It should be recognized that the acceptable impedance value 716 may not be the same for a frequency above or below the minimum impedance. Moreover, the acceptable impedance 716 may change as charging progresses, cell temperature changes, may be based on charging current levels, etc. The acceptable impedance value 716 may be greater than the minimum impedance value 712 determined above. For example, the circuit controller 210 may determine or be provided with the impedance value 716 as an acceptable impedance value for the charge signal. In general, the acceptable impedance value 716 may be any impedance at the battery cell under recharge. However, to limit the overall impedance at the battery cell during application of the charge signal, a small acceptable impedance value 716 may be selected or determined. Further, the upper impedance value 720 of the range may be an impedance value that occurs at a different frequency, or combination of frequencies, than at which the minimum impedance $f_{Min}$ 711 occurs. In many instances, there will be range of frequencies above and below the frequency $f_{Min}$ 711 at which the minimum impedance occurs and above the minimum impedance 712 but below the acceptable impedance 716. For example, the acceptable impedance of the range may occur at a higher frequency $f_{RMax}$ 710 than the frequency at which the minimum impedance occurs. The circuit controller 210 may therefore be configured to determine or select the upper impedance value 720 for the acceptable range by following the plotted curve 714 of impedance values to the right (or increasing frequencies) from the minimum impedance value 712 until the acceptable impedance value 716 is encountered. In other implementations, however, the upper impedance value 720 for the range may be a set difference (programmatic, a set delta from the minimum, computed and considering other factors like battery charge, temperature, etc.) from the minimum impedance value 712. For example, the upper impedance value for the range 720 may be determined as twice the minimum impedance value 712 or some other factor of the minimum impedance value.

Although shown in FIG. 7A as a smooth curve, the shape of the plotted curve 714 of impedance values may include various instances of noise or other effects at different frequencies. For example, the plotted impedance values 714 may be generated at different signal magnitudes such that the plotted curve 714 may include dips, particularly at higher frequencies as the magnitude of the harmonic is increased. The plot 714 may therefore be a summation of several different plots each associated with a different increment of harmonic power. In such a circumstance, the frequency $f_{Min}$ 711 corresponding to the lowest impedance 712 may stay relatively constant as the magnitudes of the harmonic are increased to a certain value, above which the impedance value starts to increase rapidly.

Further, the physical orientation of cells in a pack (such as whether connected in parallel or in series) may also influence the shape the impedance curve due to parasitic capacitive and inductive losses. For example, energy may, at specific frequency bands, start to jump the short distance through the air from one cell to cell another, effectively bypassing cells within the battery pack structure and further impeding or admitting the flow of current at that point. The measured impedance at those frequencies may cause dips in the impedance curve or areas in which the impedance appears low as cells within the pack are skipped such that, for some harmonics, particularly toward higher frequencies, a localized minimum impedance value may be determined. However, charging the battery cell or pack at these higher frequencies may not improve the efficiency of the charging of the battery cell, for the reasons explained above. As such, determining the frequency $f_{Min}$ 711 corresponding to the lowest impedance 712 may include operations to exclude dips or comparatively noisy bands in the impedance values at higher frequencies due to the parasitic losses within the battery pack. Such exclusion of the higher frequencies may be achieved through selection of inductor value 410 (or filter circuit 406,418) or may include an additional high frequency filter included in path of the charge signal in circuit 400. In one implementation, the controller 210 may compare several parameters of the battery cell or pack, such as real and imaginary impedance, admittance, and perhaps others to distinguish those regions that include a local minimum impedance value but are at higher frequencies and should be excluded. Further, the controller 210 may determine the range of frequencies associated with a detected minimum impedance value as dips in the impedance due to the parasitic losses within a battery pack are likely associated with small frequency ranges.

In addition, impedance curve plots 714 with obtained from packs in which energy jumps between cells of the pack may be utilized by the controller 210 to fingerprint or identify pack configurations. For example, a first battery pack configuration that includes cells connected in series may have an impedance plot that differs from a second battery pack configuration that includes cells connected in parallel. Detectable differences between packs of different cell count or orientation may also be used similarly. Thus, the controller 210 may obtain the impedance plot (in addition to plots of other aspects of the battery pack, like conductance and/or susceptance) for a battery pack and compare the obtained plot to a database of impedance plots. The database of impedance plots may correlate each plot with a particular battery pack configuration or battery cell type such that, through the comparison of the obtained impedance plot to the stored plots, the controller 210 may determine or estimate a configuration of the battery pack or cell type being charged. The controller 210 may then further adjust or shape the charge pulses based on the estimated battery pack configuration.

Regardless of the method by which the upper impedance value 720 for the range is determined, the circuit controller 210 may determine a corresponding frequency $f_{RMax}$ 710 of the upper impedance value 720 in operation 806. As mentioned above, the impedance at the battery cell electrodes may change based on the frequency of the charge signal applied to the electrodes. Thus, a frequency $f_{RMax}$ 710 may correspond to the selected upper impedance value 720 for the acceptable range. The circuit controller 210 may determine the frequency $f_{RMax}$ 710 that corresponds to the selected upper impedance value 720.

In operation 808, the circuit controller 210 may also select a lower impedance value 718 for the corresponding range of acceptable impedance values based on the obtained minimum impedance value 716 for the battery. Similar to the upper impedance value 720 for the range, the lower impedance value 718 may be selected or determined based on the acceptable impedance value 716 and may be at a lower frequency $f_{RMin}$ 708 than the frequency $f_{Min}$ 711 at which the minimum impedance value 712 occurs. In other words, the circuit controller 210 may be configured to determine or select the lower impedance value 718 for the range of acceptable impedance values by following the plotted curve 714 of impedance values to the left (or decreasing frequencies) from the frequency $f_{Min}$ 711 at which the minimum impedance value 712 occurs until the acceptable impedance value 716 is encountered. Thus, the upper impedance value 720 and the lower impedance value 718 may, in some instances, be equal (such as at the acceptable impedance value 716 for the range) but occur at different frequencies, e.g., above and below the frequency $f_{Min}$ 711 of the minimum impedance, of the charge signal. In another implementation, the lower impedance value 718 for the range of impedance values may be a designated difference from the minimum impedance value 712, similar to the upper impedance value 720 for the range. Regardless of the method by which the upper impedance value 720 is determined, the circuit controller 210 may determine a corresponding frequency $f_{RMin}$ 708 of the lower impedance value in operation 810. In general, the corresponding frequency $f_{RMin}$ 708 is a lower frequency than the corresponding frequency $f_{Min}$ 711 of the minimum impedance value 712. In some examples, the acceptable range or set of harmonics for generating a charge pulse may be based on the range of frequencies falling between the frequency $f_{RMax}$ 710 for the range and the frequency $f_{RMin}$ 708 for the range, which also encompasses the frequency $f_{Min}$ 711.

In still other implementations, the circuit controller 210 may not determine one or both of an upper impedance value 720 or lower impedance value 718. Rather, the circuit controller 210 may select (e.g., look-up in a table, etc.) the frequency $f_{RMax}$ 710 and frequency $f_{RMin}$ 708 for the range of impedance values. In some instances, either or both of the upper and lower frequency values may be based on the minimum impedance frequency $f_{Min}$ 711, which may be measured or obtained from memory based on previous modeling, extrapolations from previous measurements, etc. By selecting the frequency $f_{RMax}$ 710 and/or frequency $f_{RMin}$ 708 based on the minimum impedance frequency $f_{Min}$ 711 or otherwise, the circuit controller 210 may control the frequency range or bandwidth for the charge signal. Further, the frequency range may be selected to ensure that the corresponding impedance values within the frequency range remain below the acceptable threshold value 716 (or values) for charging the battery cell based on measured impedance values of the battery cell or historical measurements of the battery cell or other battery cells.

In operation 812, the circuit controller 210 may obtain magnitude values corresponding to multiple frequencies within the range of frequencies defined by the frequency $f_{RMax}$ 710 and frequency $f_{RMin}$ 708. In one implementation, the magnitudes corresponding to the frequencies within the range may be proportional to the impedance measured or estimated at that frequency. For example, the magnitude obtained for inclusion in a charge pulse at frequency $f_{RMax}$ 710 may be proportional to the real impedance value 720 at that frequency. Similarly, the magnitude obtained for inclusion in a charge pulse at frequency $f_{Min}$ 711 may be proportional to the real impedance value 712 at that frequency. Each frequency within the range may therefore have a related magnitude that corresponds to the impedance value 714 at that frequency. However, it may be noted that the impedance of each harmonic may not necessarily be independent of the magnitude of the other harmonics of the waveform.

In operation 814, the circuit controller 210 may control the pulse control signal and PWM signal of the charge circuit 400 to generate shaped charge pulses for battery cell 404. As described above, the circuit 400 of FIG. 4 may be utilized to generate pulses of the charge signal to the battery cell 404 under charge. In particular, the filter circuit 406 and/or the input shaping circuit 420 may be controlled to shape power from the upper rail 442 into a sequence of charge pulses that includes one or more frequencies or harmonics corresponding to the frequency range determined above. In one example, the filter circuit 406 may be controlled to generate a leading edge that corresponds to a sinusoidal signal at frequency $f_{RMax}$ 710 or frequency $f_{RMin}$ 708. Further, duration of the pulse control signal 416 may determine a range of harmonics for the charge pulse in that a longer duration of the pulse control signal 416 may correspond to a wider charge pulse (or a wider bandwidth of the charge pulse). In addition, the input shaping circuit 420 may be controlled via the PWM signal 426 to alter the magnitude of the charge pulse at particular instances or harmonics of the signal. In this manner, the circuit controller 210 may provide one or more inputs to the circuit 400 to shape a charge pulse to include multiple harmonics based on the determined range of frequencies defined by the frequency $f_{RMax}$ 710 and frequency $f_{RMin}$ 708. Through the method 800 of FIG. 8, the circuit controller 210 may generate a series of shaped charge pulses to provide an optimized amount of charge to the battery 404 while minimizing or reducing the impedance at the battery cell electrodes.

The determined range of frequencies and charge signal generated based on the range of frequencies may be used in accordance with method 500 of FIG. 5. In particular, the circuit controller 210 may generate a charge signal from a range of frequencies based on a first set of measured impedance values to begin charging a battery cell. Through the iterative process discussed in relation to FIG. 5, a second set of measured impedance values may be obtained during the recharge session of the battery cell. A second range of frequencies may then be determined based on the second measured impedance values and the charge signal may be adjusted accordingly. In this manner, the iterative process to adjust or alter the pulses of a charge signal during the recharging of the battery cell based on additional measurements of impedance values of the battery cell may be conducted, including recalculation of the range of frequencies or harmonics included in the charge signal.

Figure 9A:
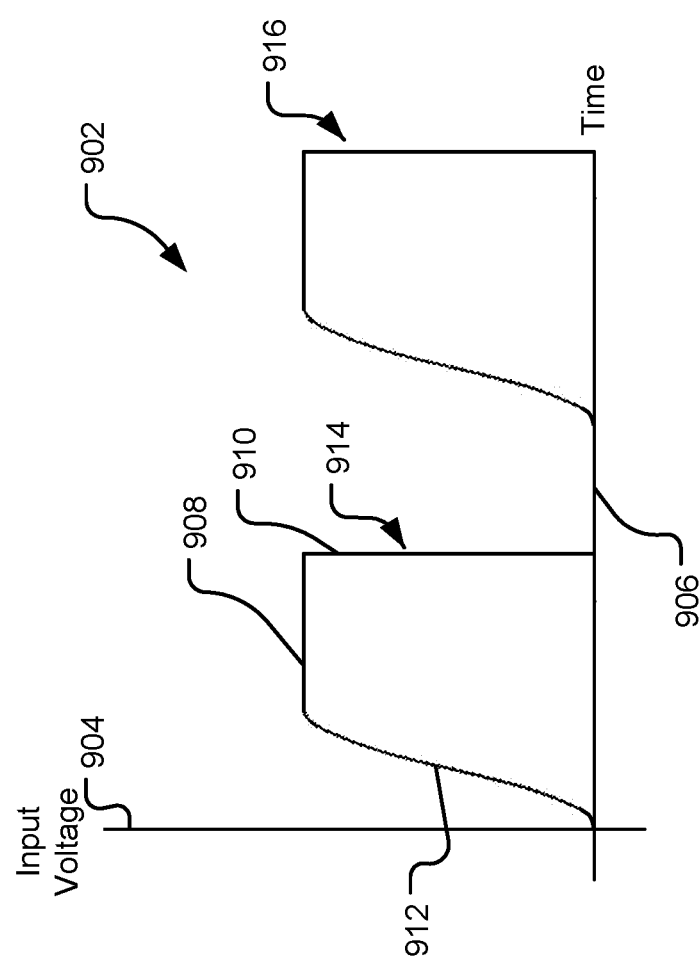
FIG. 9A is a signal diagram of a sequence of first shaped charge pulses generated from a battery charge circuit in accordance with one embodiment.

FIG. 9A is a signal diagram 902 of a sequence of shaped charge pulses 902 generated from a battery charge circuit in accordance with one embodiment. In one example, the circuit 400, based on the controller 210, may generate the shaped pulses 914, 916. The signal diagram 902 illustrates input voltage 904 or input current, in the case of a current controlled hardware circuit, versus time 906 of pulses 914, 916 of a charge signal. As can be seen, each pulse 914, 916 is asymmetric with a leading edge 912 distinctly shaped relative to the trailing edge 910. The pulses 914, 916 may be defined, in one example, by a combination of harmonics corresponding to or related to a minimum impedance value seen at the battery cell electrodes. In particular, the charge signal pulses 914, 916 may include a leading edge portion 912 that corresponds to a selected frequency that relates to the minimum impedance value for the battery cell. For example, the shape of the leading edge 912 of the pulse 914 may correspond to a harmonic $f_{Min}$ 332 identified by the control circuit 210 as the frequency at a minimum real impedance value at the battery cell. In one example, the leading edge 912 shape may be based on the leading edge of a corresponding sinusoid at the frequency of minimum impedance. In another example, the shape of the leading edge 912 of the pulse 914 may corresponding to the harmonic $f_{RMax}$ 710 or the harmonic $f_{RMin}$ 708. Identifying the minimum impedance frequency may be based on a measurement (or measurements), battery characterization, alone or in combination, among other things. Regardless of the selected frequency, the leading edge 912 of the pulse 914 may be the shaped to be the same as the leading edge of a portion of a sinusoidal charge signal at a harmonic that minimizes or reduces the impedance seen at the battery cell for a more efficient application of a power recharge signal.

To generate the leading edge 912 of the pulse 908 at the selected harmonic, the circuit controller 210 may control one or more of the filter circuits 406 discussed above. For example, the shape of the leading edge 912 of the pulse 908 may correlate to the inductance value of the first inductor 410. In particular, the first inductor 410 resists a rapid conduction of current such that current through the inductor starts slowly and increases over time. The resistance to the current flow through the inductor depends on the inductance value of the first inductor 410. Therefore, to shape the front edge 912 of the pulse 914 of the charge signal, the circuit controller 210 may activate the first transistor 412 (via the pulse control signal 416) to cause current to begin flowing through the inductor 410 to the battery cell 404. The current flow may begin slowly and increase over time and, as the voltage of the charge signal is related to the current of the charge signal, the voltage may follow the current, forming the leading edge 912 of the pulse 914 as shown in FIG. 9A. In general, the rate of increase in the current flow through the first inductor 410 may be based on the inductance value of the inductor and provide the leading edge 912 shape to the pulses 914, 916 of the charge signal. The harmonics of the leading edge 912 may therefore correspond to the inductance value of the first inductor 410. To apply the target harmonic to the leading edge 912, the circuit controller 210 may select from a plurality of filter circuits 406, 418 or first inductors to generate a slope to the leading edge 912 that corresponds to the determined harmonic of the minimum real impedance. Further, the first inductors 410 resistance to a rapid increase in current may prevent a steep front edge to the pulses of the charge signal, thereby reducing the high frequency harmonics that may occur at the battery cell 404 at the application of a square-wave input.

Through activation of the first transistor 412 via the pulse control signal 416, the circuit controller 210 may generate a leading edge 912 of the pulse 914 at a selected harmonic as current flows through the first transistor 410. At some later time in the pulse 914, the magnitude of the pulse may reach an upper or floating voltage of the power rail 442, corresponding to the constant voltage 908 at the top of the pulse 914. A duration of the pulse 908 may be controlled by the circuit controller 210 by maintaining the conducting state of the first transistor 412 such that power is provided, via first inductor 410 and first transistor 412 to the battery cell 404. In this manner, the pulse control signal 416 may control the duration or width of the pulse 914 of the charge signal.

In some instances, the circuit 400 may be controlled to include a sharp falling edge 910 of the pulse 914. The circuit controller 210 may generate the sharp falling edge 910 of the pulse by deactivating the first transistor 412 to disconnect the battery cell 404 from the power rail 442. In particular, the circuit controller 210 may deactivate the pulse control signal 416 to cause the first transistor 412 to cease conduction. As explained above, current flowing through first inductor 410 when first transistor 412 stops conduction may be returned to the power rail 442 through flyback diode 414. The control of the first transistor 412 in this manner may cause the sharp falling edge 910 of the pulse 914. Further, although a sharp falling edge 910 may typically correspond to a high harmonic component, such harmonics may not increase the damaging impedance at the battery cell 404 as current and voltage magnitudes are approaching or equal to zero (zero overpotential in the case of voltage) across the battery 404 following the sharp falling edge 910. This dissociation between higher harmonics and damaging impedance remains true when the voltage magnitude is temporarily decreased below the battery's float voltage (e.g., the battery voltage when not receiving a charge current) so as to decrease the time required for the charge current to reach zero, as explained in more detail below with reference to FIG. 12. In this manner through control of the filter circuit 406, a shaped charge pulse 418 may be created that includes a sinusoidal leading edge 912 at a harmonic that corresponds to a minimum impedance value of a battery cell 404, a duration at an upper magnitude 908, and a sharp falling edge 910 that provides sufficient charge to the battery cell 404 while maintaining a low impedance at the battery electrodes.

In general, the circuit 400 may be controlled to generate or shape the pulses of the charge signal into any shape. For example, FIG. 9B is a signal diagram 922 of a sequence of second shaped charge pulses 924, 932 generated from a battery charge circuit 400 in accordance with one embodiment. In this example, the leading edge 928 of each pulse 926, 932 may be similar to the leading edge 912 discussed above with relation to FIG. 9A. In particular, the leading edge 912 of the charge pulses 924, 932 may be generated through control of one or more of the filter circuits 406 discussed above. However, in this example, rather than a pulse with a flat voltage level 908 for the duration of the pulse after the shaped rising edge 928, the circuit controller 210 may control one or more of the input shaping circuits 420, 428 of the charge circuit 400 to further shape the pulse 924. In the example shown, the portion 926 of the pulse 924 following the leading edge 928 may include a uniformly decreasing voltage (or current) until the sharp falling edge 930. Although the declining level (or slope) 926 is illustrated as linear, but it need not be and the pulse 924 may shaped to include many features. In one implementation, the control circuit 210 may provide the PWM signal 426 to a second transistor 422 of the input shaping circuit 420. As explained above, the PWM signal 426 may be a high frequency switching signal that alternates the second transistor 422 between a conducting state (or "on" state) and a non-conducting (or "off" state). The rapid, alternating operation of the second transistor 422 may cause current from the pulse 924 to flow through second inductor 424. This siphoning of current from the pulse 924 may result in the downward slope portion 926 as current is removed. In general, the duty cycle of the PWM signal 426 may control the amount of current pulled from the pulse 926 and may be configured by the circuit controller 210 to generate the slope 926 of the pulse 924. Further and as explained above, the off portion of the PWM signal 426 may close the transistor 422 rapidly enough that little or none of the siphoned energy signal from the charge pulse is transmitted to ground via connection 446. Rather, the siphoned energy may be transmitted via flyback diode 430 to the upper rail 442 and stored in the storage capacitor 432 for reuse by the charging circuit 400.

At the end of the period of the charge pulse 924, the circuit 400 may be further controlled to define a sharp falling edge 930 as discussed above with relation to FIG. 9A. In particular, the circuit controller 210 may generate the sharp falling edge 910 of the pulse by deactivating the first transistor 412 to disconnect the battery cell 404 from the power rail 442. In particular, the circuit controller 210 may deactivate the pulse control signal 416 to cause the first transistor 412 to cease conduction. In still other examples, the input shaping circuit 420 may also be activated via the PWM signal 426 to siphon current at the falling edge 930 to further shape the falling edge of the pulse 924. As should be appreciated, the charge pulses 924, 932 illustrated in FIG. 9B are merely examples of a shaped charge signal that may be generated through control of the charge circuit 400. In particular, the circuit controller 210 may control the filter circuit 406 and/or the input shaping circuit 420 to generate a charge pulse of various shape as desired. In this manner, other charge signal shapes may be generated from the circuit 400, such as that illustrated in FIGS. 3A, 7B, and/or 9A.

Figure 10B:
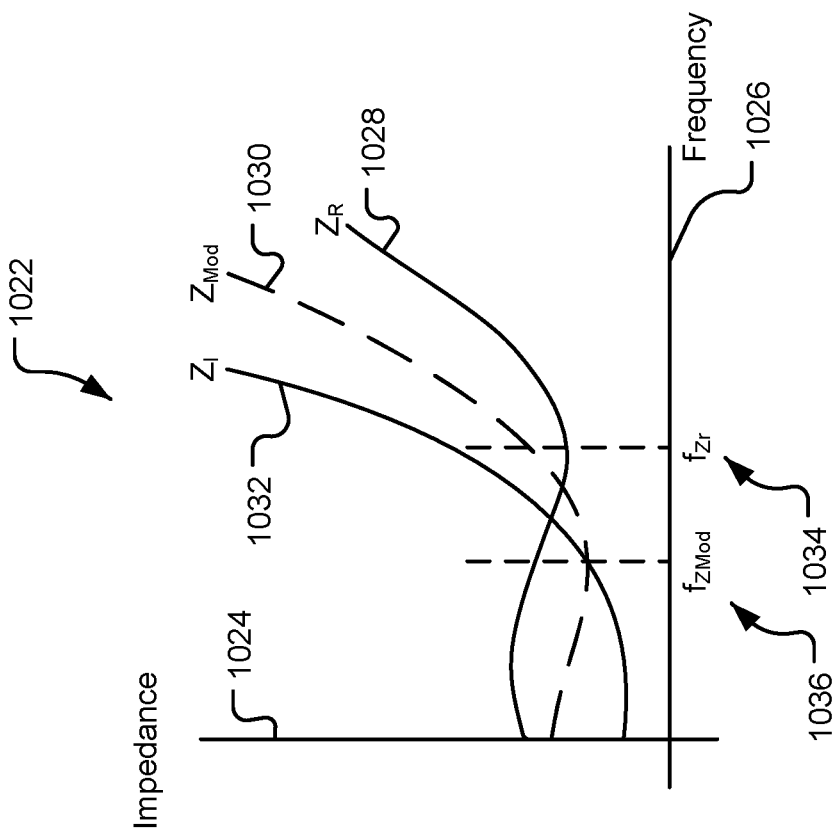
FIG. 10B is a graph of a measured real impedance values, imaginary impedance values, and modulus impedance values of a battery cell to corresponding frequencies of a charge signal applied to the battery cell in accordance with one embodiment.
Figure 10A:
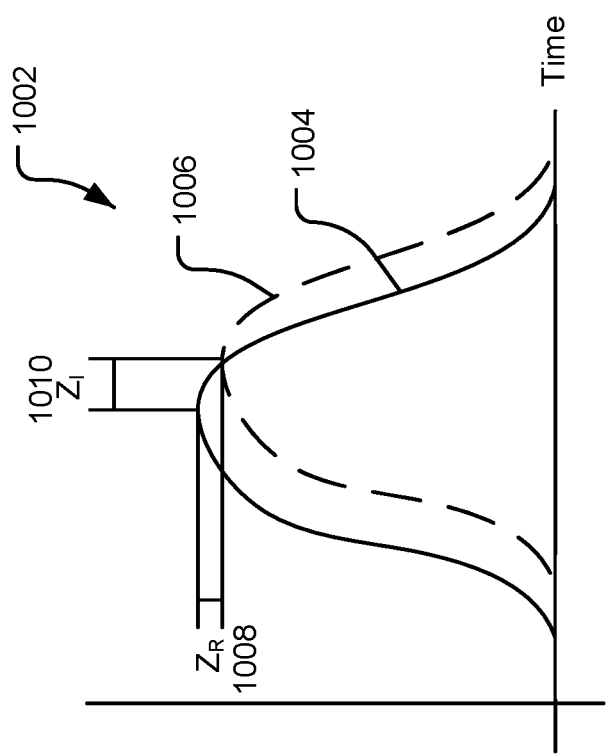
FIG. 10A is a signal diagram of a charge signal applied to a battery over time to illustrate real impedance values and imaginary impedance values of the battery in accordance with one embodiment.

Although discussed above in relation to real impedance values at the battery electrodes, the reactance or imaginary portion of the impedance at the battery electrodes may also be considered when shaping a charge signal. Other aspects, such as admittance values and/or susceptance values may also be considered. In particular, FIG. 10A is a signal diagram illustrating a sinusoidal voltage signal 1004 used to generate a charge current 1006 to recharge a battery cell. In general, the charge current 1006 measured at the battery cell may have the same shape as the applied voltage signal 1004. However, due to the impedance of the battery, the charge current 1006 applied to the battery may be smaller in magnitude and time-delayed in relation to the voltage signal 1004. The qualitative difference in magnitude between the voltage signal 1004 and the current 1006 at the battery is meant to illustrate the measurement of real impedance $Z_R$ 1008, as ZR(dV/dI) or ($\Delta V/\Delta I$). One or more of the methods and circuits discussed above consider this real component when shaping pulses of a charge signal for recharging the battery. The delay in time between the voltage signal 1004 and the application of the current 1006 at the battery is illustrated as $Z_I$ 1010 and is due to the reactance or imaginary component of the battery impedance. Similar to the real component of the impedance, the reactance 1010 portion of the impedance may also cause inefficiencies in application of a charge signal to the battery during a charging session. For example, the period of a charging waveform is generally measured from when either the charge voltage or current initiates the recharge of the battery and ends when the voltage has settled back to zero overpotential (the voltage at the terminals matches the floating voltage of the battery) and there is no charging current (zero amps) into the battery. However, charging systems that ignore the reactance portion of impedance at the battery cell may assume that the voltage and resulting charge current waveform into the battery start and stop at the same times. Accounting for the reactance portion of the impedance, however, indicates a capacitive or inductive induced time delay between the voltage and current waveforms at the battery cell, which results in a longer charge period per pulse due to the delay between the voltage and current of the charge signal. This, in turn, may decrease the average current across the charge period of the pulse, resulting in an increased inefficiency of the charge pulse at the battery cell. In addition, depending on the reactance level, the reactance component may redirect energy to the formation of heat instead of stored chemical energy within the battery. Reactance can become problematic and generate heat within the conductive pathways (such as cables, wires, and circuit board traces) as well as the cell, itself. A high degree of reactance may also contribute to inhomogeneous electrochemical activity across the area of the electrodes, exacerbating ohmic drops across the current collectors, electro-active materials, and other components within the battery cell.

To address this potential inefficiency in applying a charge pulse to a battery cell, the system may generate a charge signal with pulses corresponding a determined or estimated reactance component of the impedance at the battery cell. In particular, the pulse shape and overall period of the pulses of the charge signal for recharging a battery cell may also be tailored to correspond to the imaginary component of impedance as well as the real component of the impedance. For example, reference is now made to FIG. 10B which illustrates a graph 1022 of various components of the impedance 1024 at a battery versus a frequency 1026 of a charge signal applied to the battery. In particular, the graph 1022 includes a plot of real impedance values 1028, a plot of imaginary impedance values 1032, and a plot of calculated modulus impedance values 1030. Through the methods discussed herein, a frequency $f_{Zr}$ 1034 that corresponds to a minimum real impedance value may be determined and utilized to generate a charge signal with pulses including harmonics at the noted frequency or within some range of frequencies above and/or below. However, as shown in the graph 1022, the frequency $f_{Zr}$ 1034 that corresponds to a minimum real impedance value may be associated with a relatively higher imaginary impedance 1032 value at the battery electrodes. Thus, only accounting for the real impedance does not consider the imaginary impedance and its effect on charge efficiency, and may not lead to the most optimal charge solution. As such, some implementations of the circuits and methods described herein may optimize the frequency from which a pulse shape is defined, and the period of the overall charge signal applying such pulses, by accounting for both imaginary and real impedance to varying degrees, such as through understanding the frequencies of both components of the impedance at the battery cell. Still other implementations may use admittance values and/or susceptance values calculated from the measured real impedance and/or the measured imaginary impedance at the battery cell.

In one example, the circuit controller 210 may calculate or otherwise obtain a combination of the real impedance values and the imaginary impedance values to select a frequency or harmonic at which a pulses of a charge signal are generated. One such combination may include a modulus calculation of the real and imaginary impedance values. A plot of impedance modulus values 1030 is illustrated in the graph 1022 of FIG. 10B. Other combinations of both components of the impedance at the battery may also be calculated or determined by the circuit controller 210 and used in shaping pulses of a charge signal. For example, one or both of the real impedance and the imaginary impedance values may be weighted disproportionally (such as applying a 20% weight to the real impedance value and an 80% weight to the imaginary impedance value) or proportionally and may be used to determine different aspects of the pulses of the charge signal, such as the leading edge or width of the charge pulse. Similar to above, the circuit controller 210 may determine a minimum impedance modulus value and a corresponding frequency (illustrated in the graph 1022 as frequency $f_{ZMod}$1036). As can be seen in graph 1022, generating a charge pulse with harmonics at frequency $f_{ZMod}$ 1036 may introduce a higher real impedance at the battery than other frequencies and particularly with comparison to $f_{Zr}$, but may minimize or lessen an imaginary impedance component. As such, by considering both components of the impedance (real impedance 1028 and imaginary impedance 1032) at the battery cell, a more efficient charge signal may be generated. Consideration of both components of the impedance at the battery cell may become particularly useful for systems with multiple cells in which impedance is added by the connections between the multiple cells.

In some instances, the circuit controller 210 may select a frequency for the charge signal that is different than either frequency $f_{Zr}$ 1034 corresponding to a minimum real impedance value or frequency $f_{ZMod}$ 1036 corresponding to a minimum modulus impedance calculation. Rather, the circuit controller 210 may balance the real impedance values and the imaginary impedance values to determine a harmonic for the charge signal such that the selected frequency for the charge signal may be between frequency $f_{Zr}$ 1034 and frequency $f_{ZMod}$ 1036.

Figure 11:
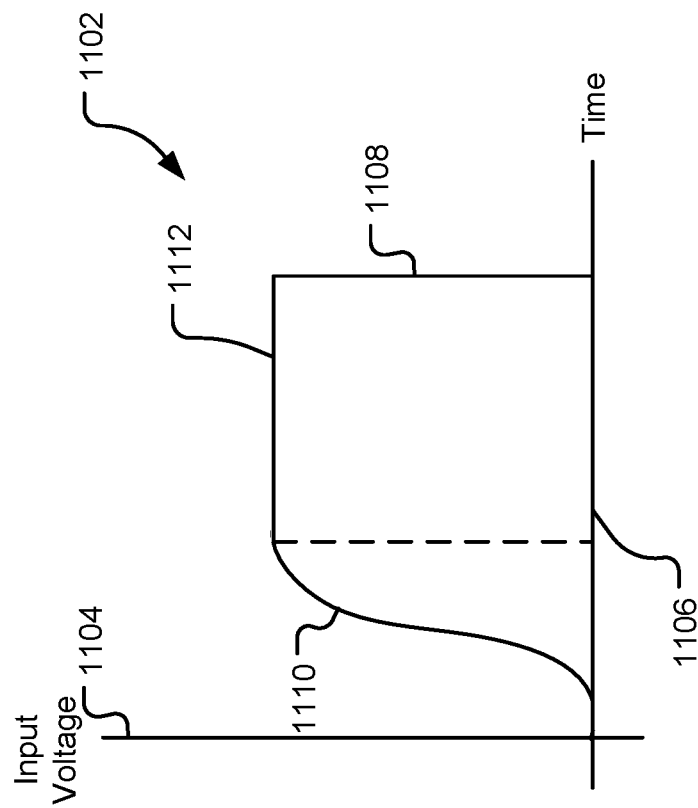
FIG. 11 is a signal diagram of a shaped battery cell charge signal including a leading edge portion and a body portion generated from a battery charge circuit in accordance with one embodiment.

In one particular implementation, separate portions of a pulse of a charge signal may be shaped by the circuit controller 210 based on more than one impedance measurement. For example, FIG. 11 is a signal diagram of a shaped pulse 1108 of a battery cell charging signal 1102 generated from a battery recharge circuit corresponding to two or more frequencies in accordance with one embodiment. Similar to the power signal pulses discussed above with reference to FIG. 9, the pulse 1108 may include a leading edge portion 1110 configured as a harmonic corresponding to a minimum real impedance value. For example, the shape of the leading edge 1110 portion of the pulse 1108 may correspond to a harmonic $f_{Zr}$ 1034. A second portion 1112 of the pulse 1108, however, may include the harmonic based on another frequency different than frequency $f_{Zr}$ 1034. For example, the leading edge portion 1110 and a second portion 112 taken together may include a primary harmonic $f_{ZMod}$ 1036 corresponding to a minimum modulus impedance calculation 1030. Applying harmonic $f_{ZMod}$ 1036 corresponding to a minimum modulus impedance calculation may determine the duration of the second portion 1112 of the pulse 1108 to reduce the imaginary impedance at the electrodes of the battery from the application of the power recharge signal. By determining and applying harmonics based not just on the real impedance component at the battery, but on the imaginary impedance component, a more efficient power recharge signal may be used to charge the battery cell.

Figure 12A:
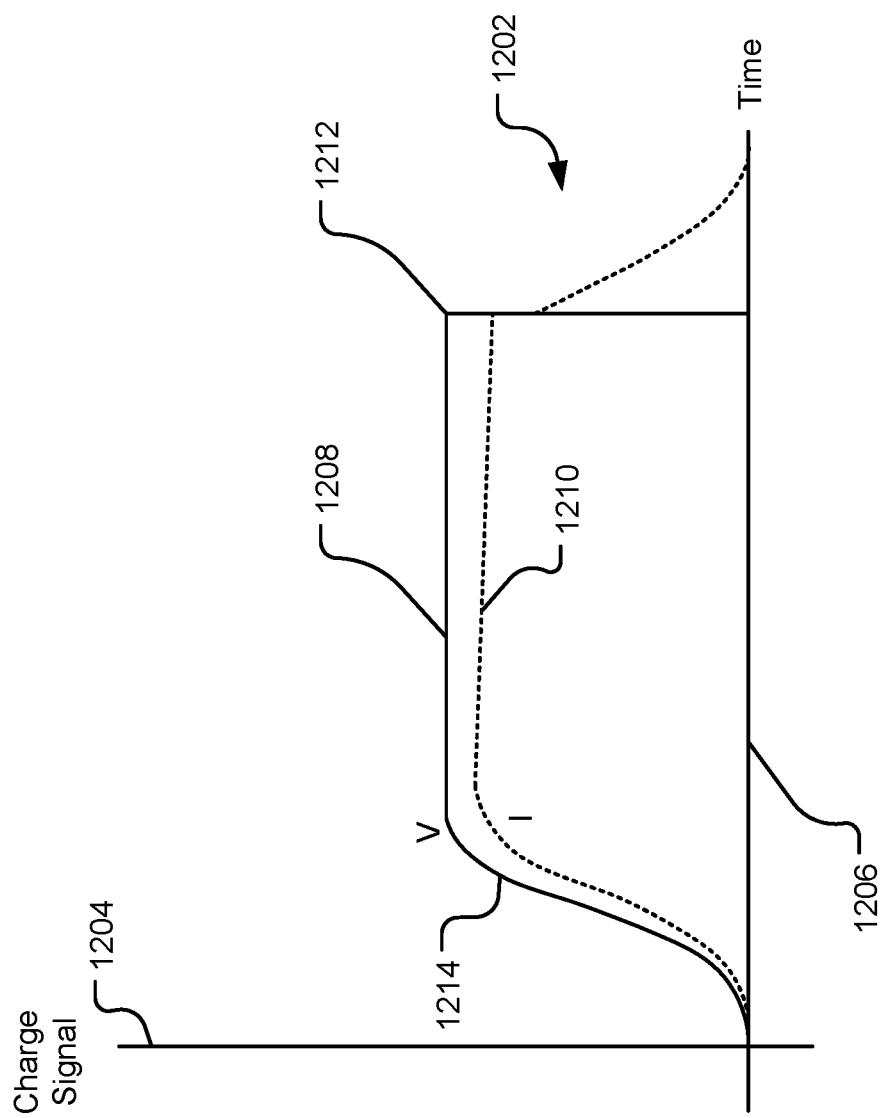
FIGS. 12A and 12B are plots of a measured voltage drop across a battery and a measured current at battery charge in response to a charge signal applied to the battery in accordance with one embodiment.
Figure 12B:
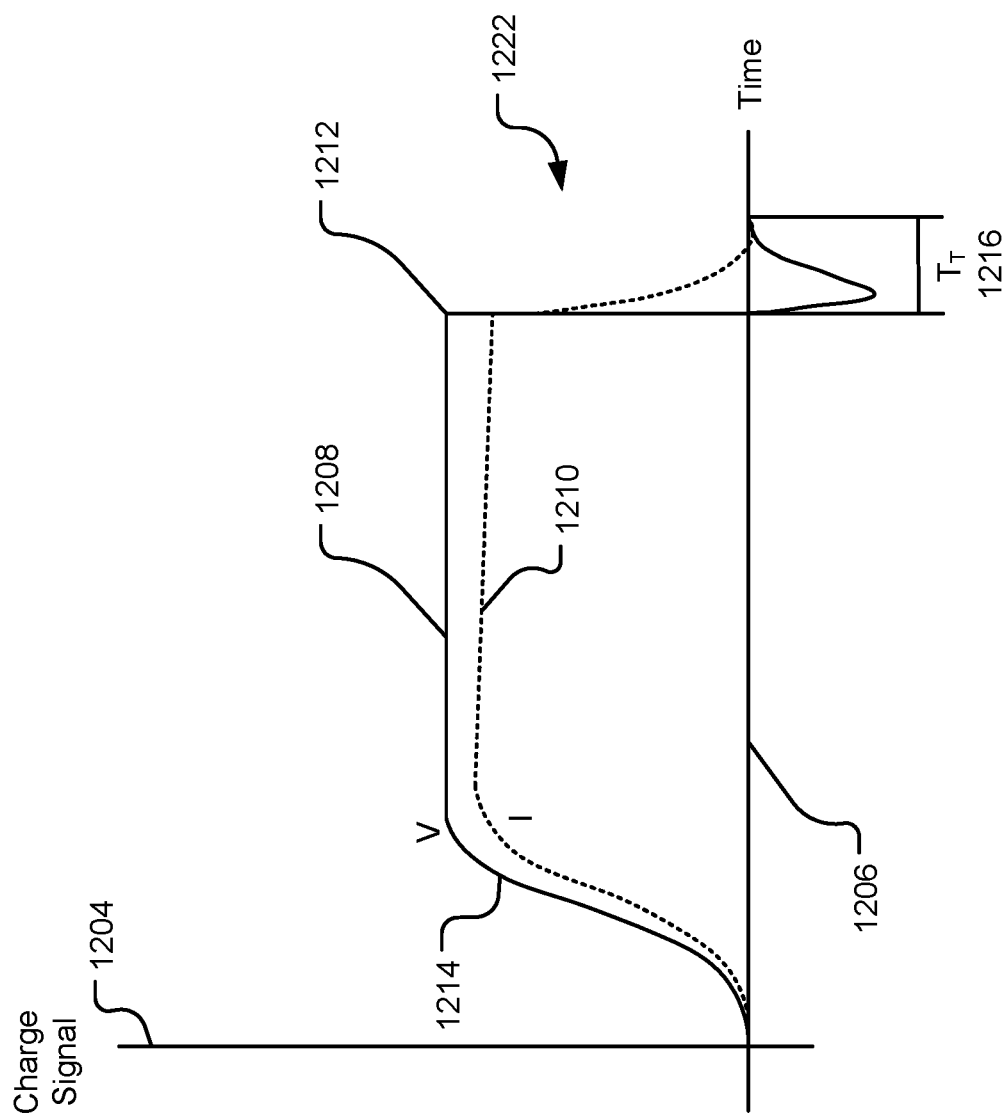

Still other aspects of the pulses of the charge signal may be controlled by the circuit 400. In particular, advantages in efficiency in charging a battery cell may be obtained through control of a falling edge of the pulses of a charge signal. FIGS. 12A and 12B are plots of the applied/measured voltage 1208 across a battery cell and a measured charge current at battery cell 1210 versus time 1206 in accordance with one embodiment. As discussed above, the charge signal may include a sharp falling edge to remove the charge signal 1212 to the battery cell. As can be seen in the plot of FIG. 12A, however, when voltage applied to the battery is set to zero, the current I does not immediately fall to zero but rather has some delay before reaching zero. However, the time between pulses may be set such that the next pulse does not start until the current reaches zero (cell is depolarized). Thus, in one example, the circuit 400 may be controlled to wait until the current at the battery cell 404 reaches zero before the next pulse of the charge signal may begin to prevent potential damage to the battery cell or otherwise inefficient charging from beginning to polarize the cell before complete depolarization occurs. Since charging can only occur during a pulse, reducing or minimizing the time between pulses would reduce overall charge time given other conditions are the same. For a voltage-controlled variant of the circuit 400, the current 1210 component of the charge signal may lag behind the voltage component 1208. More particularly and as shown in FIG. 12A, the current 1210 at the battery may take some time to return to zero after the voltage 1208 to the battery is removed. This delay in the current at the battery returning to zero may add additional inefficiencies to the charge pulse. Therefore, in some implementations and as shown in the plot 1222 of FIG. 12B, the voltage 1208 of the charge signal may be controlled to drive the voltage below a transition voltage corresponding to a zero current, represented in the plot 1222 of FIG. 12 as line 1206. In general, the transition voltage 1206 is the voltage of a charge signal at which current flow into the battery is reversed and may be similar to the float voltage of the battery cell. In particular, driving the voltage 1208 below the transition voltage 1206 for a period of time (illustrated as period $T_T$ 1216) following the falling edge 1212 of the pulse may drive the current 1210 to zero amps at a faster rate as compared to a pulse without the blip. The duration $T_T$ 1216 during which the voltage 1208 of a voltage-controlled charge circuit 400 is controlled below the transition voltage corresponding to a zero current may be determined or set by the circuit controller 210 to minimize the time for the current 1210 at the battery cell 404 to return to zero amps. In one example, voltage dip may be controlled to not go below a recommended cell voltage minimum for the battery cell so as to protect the electrodes of the battery cell from deterioration. The magnitude of the voltage dip may also be controlled to be some percentage of the charge pulse magnitude relative to the transition voltage. Further, the return of the voltage to the transition voltage may be controlled at a rate that keeps the current at zero amps for as long as charges within the battery cell are still balancing. Once the current 1210 has returned to zero amps for a particular rest period, another charge pulse 1202 may be applied to the battery cell 404. Thus, reduction in the time needed for the current 1210 at the battery cell 404 to return the zero may increase the rate at which the charge pulses may be applied to charge the battery cell.

Although generally discussed above as a power-controlled circuit, it should be appreciated that the charge circuit 400 may be voltage-controlled, current-controlled, or may take advantage of each in different circumstances. Both approaches are controlled similarly by measuring a voltage drop across the battery cell 404 and measuring current via a current-sensing resistor connected in series to the battery cell 404. The primary difference between control schemes is based on whether the current sensing hardware (such as the current-sensing resistor) is external or internal to the power source circuitry (such as a power amplifier of the power source circuitry 402) and whether the voltage drop across the battery cell 404 or the current-sensing resistor is processed first. For a voltage controlled power source, a primary voltage measurement may occur across the battery cell 404 while the corresponding voltage drop across an external current-sensing resistor may be secondarily measured so that a current at the battery cell 404 may be calculated, such as utilizing Ohm's Law. This allows the voltage of the charge signal to be precisely controlled while the current is calculated such that the voltage across the battery cell 404 is measured first, followed by the calculation of the current at the battery cell.

Voltage-controlled charge circuits may, in some instances, be controlled to provide a charge signal with components as illustrated in FIG. 12. In particular, the voltage of the charge signal 1202 may be controlled to provide the sinusoidal leading edge 1214 as described above, followed by a flat voltage for the remaining body of the pulse. The voltage-controlled charge signal may provide the benefits to the charge pulse as described above. A falling edge 1212 may also be provided from the voltage-controlled circuit 400 that includes a portion 1216 in which the voltage is driven below a transition voltage corresponding to a zero current at the battery cell 404. As also shown in FIG. 12, the current 1210 at the battery cell 404 may lag behind controlled voltage 1208, illustrating the calculation of the current following the control of the voltage 1208. Through control of the voltage signal 1208, the current 1210 may return to zero amps before an additional charge pulse is provided to the battery cell 404 in a similar manner. An additional advantage of a voltage-controlled circuit 400 provides precise control to ensure thermodynamic thresholds of the battery cell 404 are not exceeded to prevent breakdown of battery cell 404 properties, such as staying below voltages at which electrolyte of the battery cell 404 begins to breakdown.

Figure 13:
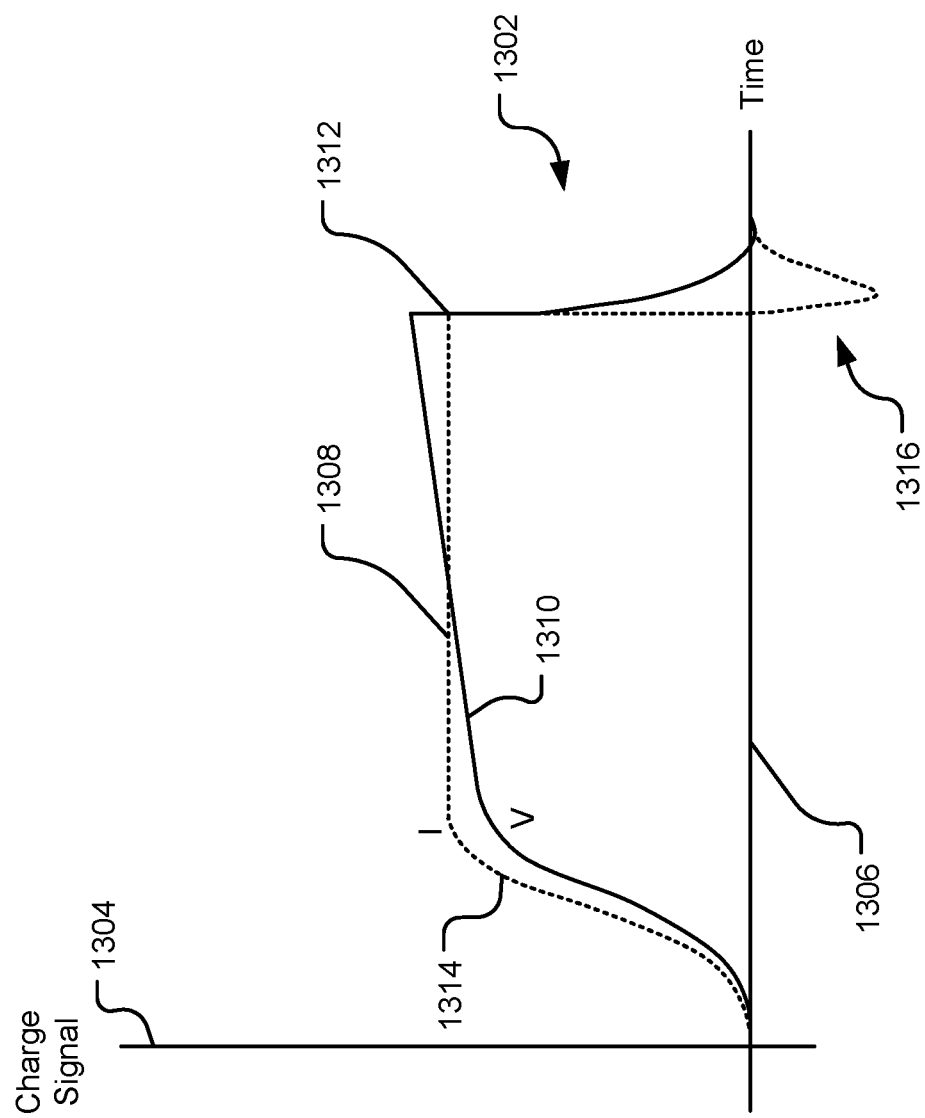
FIG. 13 is a plot of a measured current across a current-sensing resistor and a voltage at battery in response to a charge signal applied to the battery versus time in accordance with one embodiment.

The circuits and methods discussed herein may also be implemented utilizing a current-controlled power source. For a current controlled power source of circuit 400, a pre-calibrated sense resistor within the power source circuitry may provide the primary measurement such that current flowing across this resistor may be dependent on the current that flows through the battery cell 404. Thus, knowing the charge current precisely allows charge current to the battery cell 404 to be precisely controlled without knowing the voltage drop across the battery cell. In this implementation, the current into the battery cell 404 (as measured at the current-sensing resistor) may be intrinsically known (via the pre-calibrated voltage drop across the sense resistor) while the voltage across the battery cell 404 is measured as a result of this applied current. FIG. 13 is a plot of a measured current 1314 across a current-sensing resistor and a voltage 1310 at battery cell in response to a charge signal 1304 applied to the battery cell versus time 1306 in accordance with one embodiment. As shown in the plot 1302, the current to the battery cell 404 may be controlled to produce a similar pulse as described above with a leading sinusoidal leading edge 1314 perhaps corresponding to a minimum impedance value at the battery cell 404, followed by a steady current. A falling edge 1312 may also be provided from the current-controlled circuit 400 that includes a portion 1316 in which the current is driven below zero amperes corresponding to the stable transition voltage at the battery cell 404. As also shown in FIG. 13, the voltage response 1310 at the battery cell 404 may lag behind controlled current 1308, illustrating the behavior of the voltage as a feedback response rather than a primary control factor.

In applications where simple components may be used, or the process is constrained by the existing power hardware on a device under charge, current control may be the default mechanism. Alternatively, implementations in which both controller response time and transient response of the battery is fast, the voltage-controlled or current-controlled methods may behave similarly. As frequencies increase and/or if the battery exhibits higher levels of reactance, however, the behavior between the two methods may diverge and practical control considerations may be addressed.

Implementations discussed above involve measuring or otherwise obtaining the impedance of a battery cell 204, real and or imaginary, to determine a frequency component of at least a portion of a pulse of a charge signal. The impedance values of the battery cell 204 may be obtained in a variety of ways or methods. In one implementation, the impedance at the battery cell 204 may be measured or estimated in real-time as a charge pulse is applied to the battery cell. For example, aspects of the magnitude and time components of the voltage and current waveforms of the charge signal at the battery cell 204 may be measured and/or estimated. Differences between the measured magnitude and time components of the voltage and current waveforms may be used to determine or estimate real, imaginary, or approximated impedance at the battery cell 204. For example, real and imaginary impedance values may be determined from the leading edge of the charge pulse, as the leading edge is comprised from a single, known harmonic and the difference in the magnitude of the voltage and current waveforms may be taken at a consistent minimum and maximum of the edge. Similarly, aspects of the impedance may be approximated from magnitude measurements of the voltage and current waveforms at the falling edge of the charge pulse. In still other implementations, the various measurements of the voltage and current waveforms of the charge signal may be adjusted based on weighted values applied to the measurements. In general, several aspects of the voltage and current waveforms of the charge signal may be determined or measured to determine or estimate the impedance at the battery cell 204. In another implementation, hundreds or thousands of measurements of the voltage or current waveforms may be obtained and analyzed via a digital processing system. In general, higher fidelity and/or more measurements of the waveforms may provide a more accurate analysis of the impedance of the waveform as applied to battery cell 204 to better determine the harmonic components of the charge signal at which minimum impedance values occur or other aspects of the effect of the waveforms on the battery cell 204 to determine the shape of pulses of the charge signal.

Figure 14:
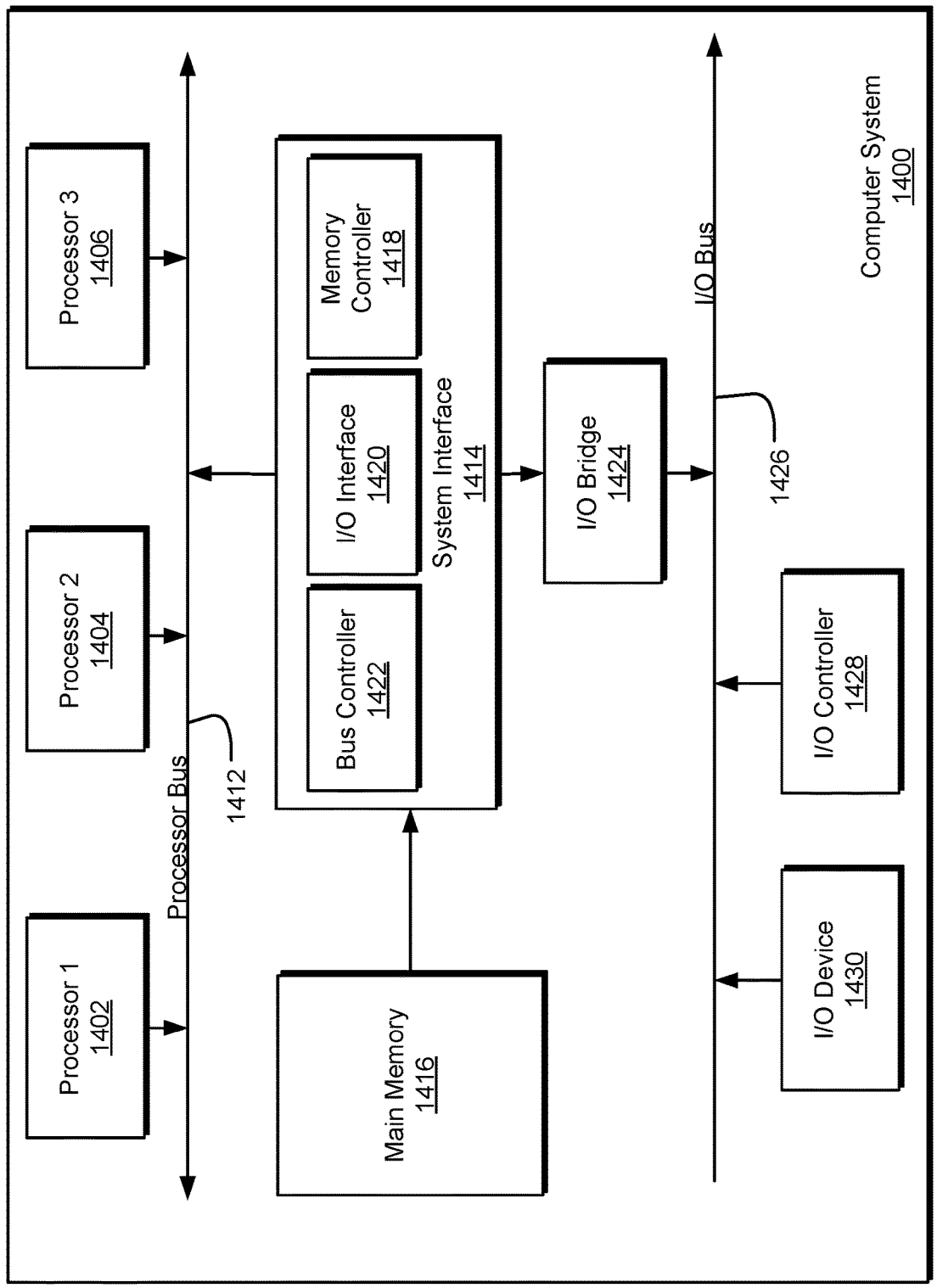
FIG. 14 is a diagram illustrating an example of a computing system which may be used in implementing embodiments of the present disclosure.

FIG. 14 is a block diagram illustrating an example of a computing device or computer system 1400 which may be used in implementing the embodiments of the network disclosed above. In particular, the computing device of FIG. 14 is one embodiment of the circuit controller 210 that performs one of more of the operations described above. The computer system (system) includes one or more processors 1402-1406. Processors 1402-1406 may include one or more internal levels of cache (not shown) and a bus controller or bus interface unit to direct interaction with the processor bus 1412. Processor bus 1412, also known as the host bus or the front side bus, may be used to couple the processors 1402-1406 with the system interface 1414. System interface 1414 may be connected to the processor bus 1412 to interface other components of the system 1400 with the processor bus 1412. For example, system interface 1414 may include a memory controller 1418 for interfacing a main memory 1416 with the processor bus 1412. The main memory 1416 typically includes one or more memory cards and a control circuit (not shown). System interface 1414 may also include an input/output (I/O) interface 1420 to interface one or more I/O bridges or I/O devices with the processor bus 1412. One or more I/O controllers and/or I/O devices may be connected with the I/O bus 1426, such as I/O controller 1428 and I/O device 1430, as illustrated.

I/O device 1430 may also include an input device (not shown), such as an alphanumeric input device, including alphanumeric and other keys for communicating information and/or command selections to the processors 1402-1406. Another type of user input device includes cursor control, such as a mouse, a trackball, or cursor direction keys for communicating direction information and command selections to the processors 1402-1406 and for controlling cursor movement on the display device.

System 1400 may include a dynamic storage device, referred to as main memory 1416, or a random access memory (RAM) or other computer-readable devices coupled to the processor bus 1412 for storing information and instructions to be executed by the processors 1402-1406. Main memory 1416 also may be used for storing temporary variables or other intermediate information during execution of instructions by the processors 1402-1406. System 1400 may include a read only memory (ROM) and/or other static storage device coupled to the processor bus 1412 for storing static information and instructions for the processors 1402-1406. The system set forth in FIG. 14 is but one possible example of a computer system that may employ or be configured in accordance with aspects of the present disclosure.

According to one embodiment, the above techniques may be performed by computer system 1400 in response to processor 1404 executing one or more sequences of one or more instructions contained in main memory 1416. These instructions may be read into main memory 1416 from another machine-readable medium, such as a storage device. Execution of the sequences of instructions contained in main memory 1416 may cause processors 1402-1406 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 1416. Common forms of machine-readable medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

It may be desirable to allow a battery powered electronic system to be operable under charge. So, for example, it would be advantageous for a battery powered tool to be operated while being charged. Similarly, electronic systems may operate in various states while under charge. For example, a mobile phone, tablet, lap top computer or the like, may be fully operational under charge, or may operate in various lower power modes while under charge or some limited functionality may be operable while under charge. In accordance with aspects of the present disclosure, a power converter, such as a buck or boost converter, may be operated synchronously or otherwise in coordination with the circuitry controlling the charge waveform and otherwise controlling the energy flux at the electrode of the electrochemical device, e.g., battery cell. The charge waveform may include a frequency component and/or a harmonic or harmonics associated with a minimum or otherwise low impedance, including the real and/or imaginary components thereof or some combination thereof, of the electrochemical device being charged. The system may be controlled to coordinate the charge signal with the power signal to the load to not interfere with the form or composition of the charge waveform. As the charge signal is purposefully controlled, it is advantageous to not alter its form or composition. Particularly, the system may control the power signal so as not to interfere with the harmonically shaped leading edge of the charge pulse. So, for example, the harmonically defined leading edge of the charge form is maintained, e.g., not distorted, while also supplying power to whatever the load. In another example, the system coordinates the power converter operation to shape the charge signal and/or to act in conjunction with or in place of the recycle function. The discharge (power signal) from the battery may also be tuned with a frequency/harmonic component based on discharge impedance, which impedance may be the same or different as the charge impedance used to tune frequency/harmonic components of the charge waveform. Nonetheless, aspects of the discharge signal may be tuned.

Figure 15:
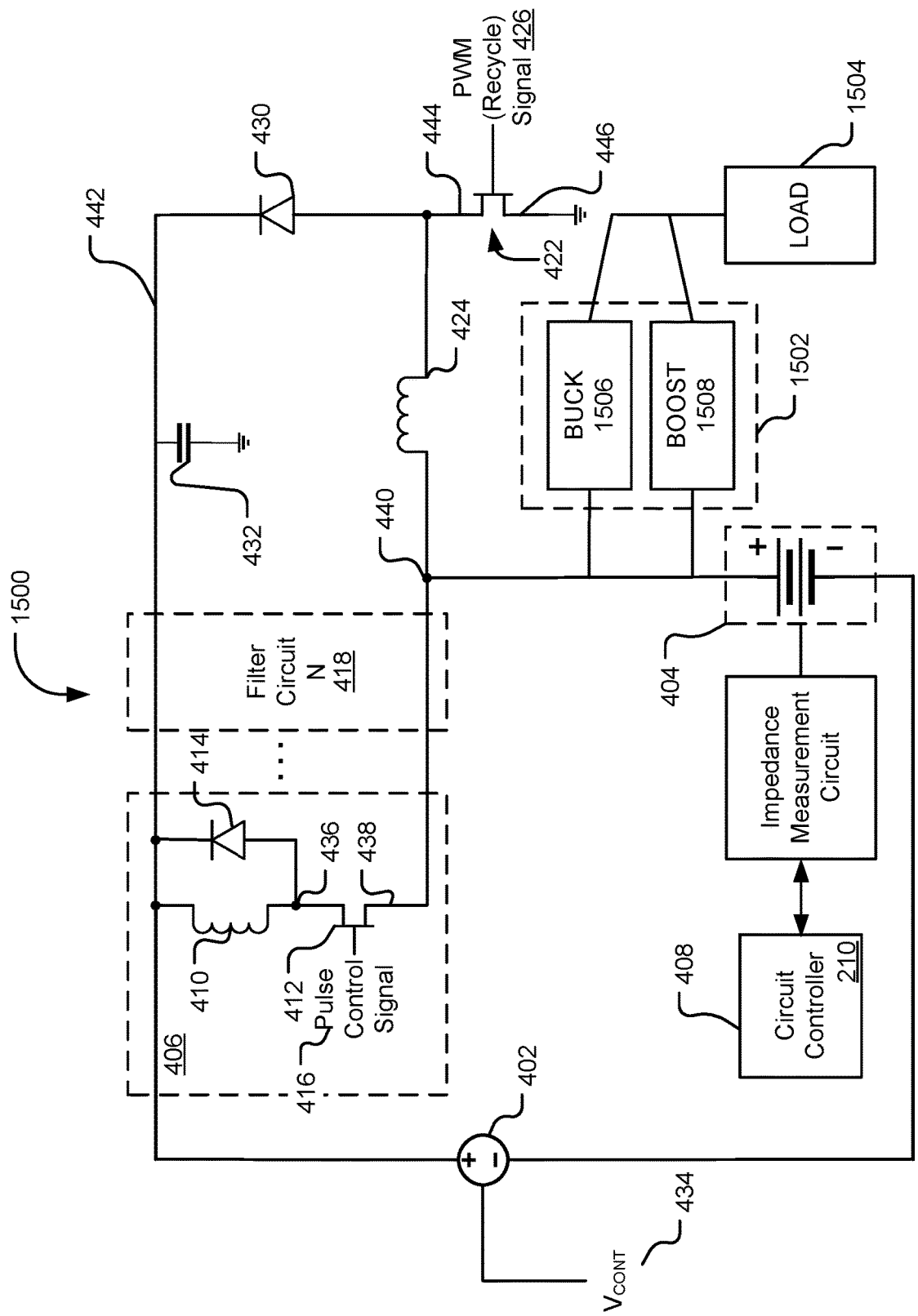
FIG. 15 is a diagram of a circuit for defining a charge signal and for providing a power conversion function for powering a load while charging a battery for the load, in one example.

FIG. 15 is a circuit diagram illustrating one possible example of a circuit topology 1500 that generates a shaped waveform based on impedance of the cell (or other measurements like susceptance) under charge. The system includes components introduced relative to FIG. 4, and hence like reference numbers refer to like components between FIG. 4 and FIG. 15. Generally speaking, the circuit includes the filter circuits 406 and 418 that may alone or cooperatively shape the waveform, e.g., the leading edge of the pulse that may alone or cooperatively shape the waveform, e.g., the leading edge of the charge pulse, based on a harmonic or harmonics and their effects on impedance. As discussed above, the filter circuit portions may each include a shaping inductor 410. The filter circuit portions may include inductors of the same or different values. In contrast to the circuit illustrated in FIG. 4, the circuit of FIG. 15 includes a power converter 1502 coupled between the electrochemical cell 404 and a load 1504. In one example, the power converter is a buck converter 1506. Generally speaking, a buck converter steps down a voltage of the source to whatever is required by the load. In another example, the power converter is a boost converter 1508. Generally speaking, the boost converter steps up the voltage of the source to whatever is required by the load. In another example, both a boost and buck converter may be provided, in parallel, and operated depending on the operational state or the type of the load or loads. The operation of the buck and boost may also be coordinated to maintain a voltage output that is between the maximum battery voltage and minimum battery voltage. As will be further discussed below, it is also possible to include one or more parallel buck and/or boost circuits to provide alternative output pulse control.

Figure 16:
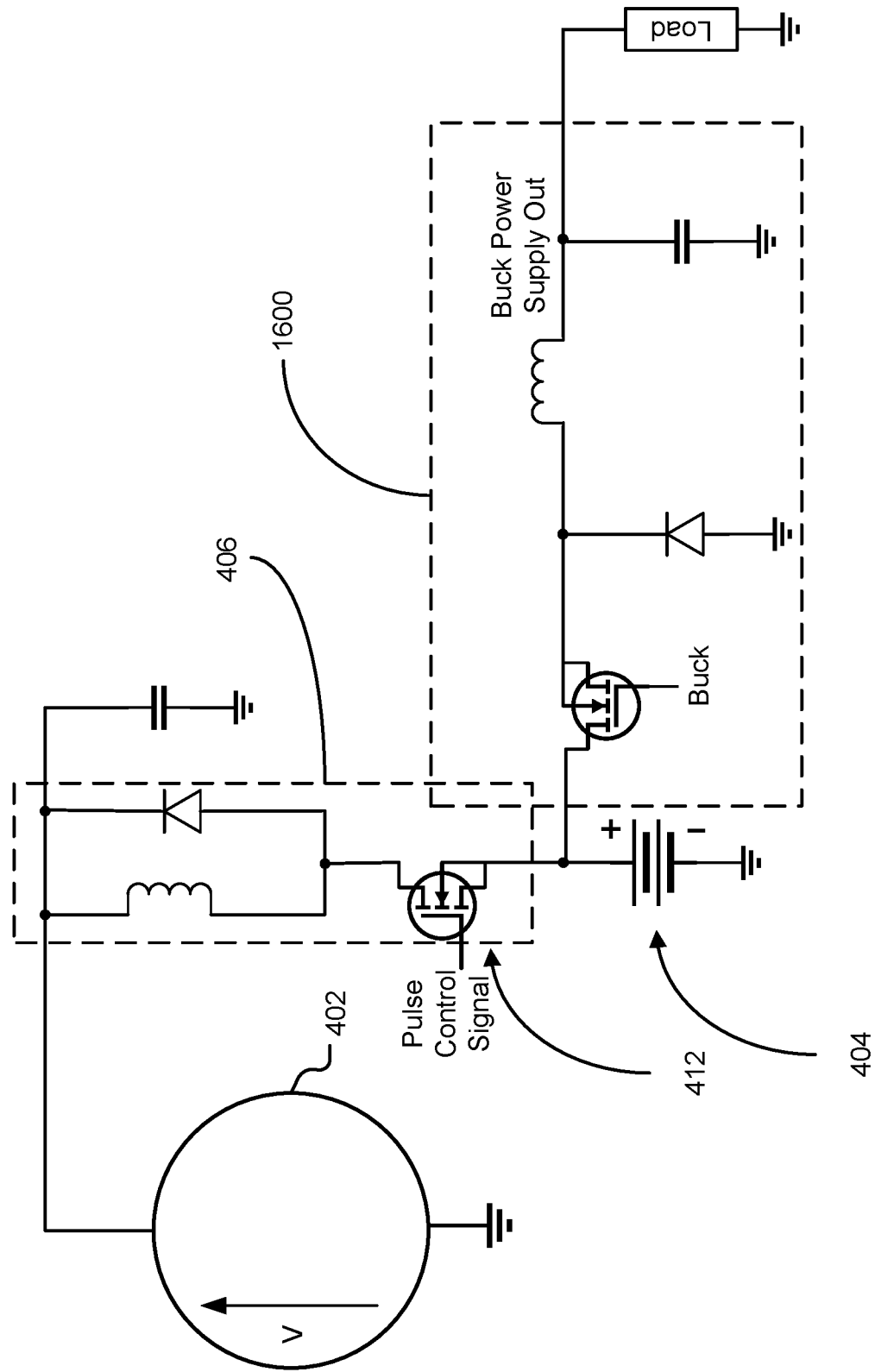
FIG. 16 is a diagram of a circuit for defining a charge signal and for providing a buck function for powering a load while charging a battery for the load, in one example.
Figure 17:
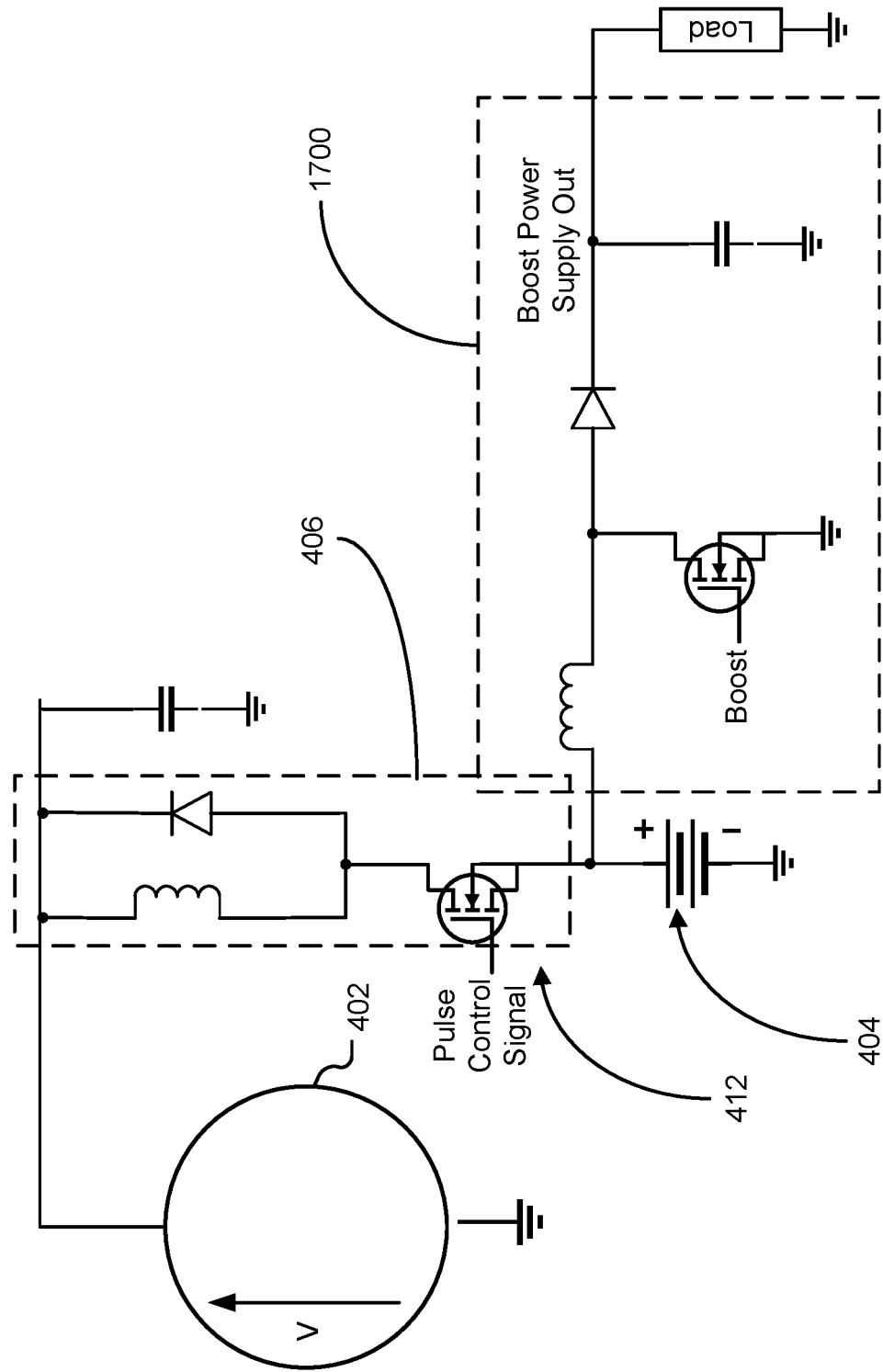
FIG. 17 is a diagram of a circuit for defining a charge signal and for providing a boost function for powering a load while charging a battery for the load, in one example.

Various possible examples of buck and boost circuit topologies exist. FIG. 16 illustrates one example of charge circuit employing a buck converter coupled between the electrochemical cell and the load. The circuit includes a filter circuit 406, such as described above with reference to FIG. 4 and elsewhere, that is controlled by way of control signals, labeled "pulse" to the filter transistor from a controller (e.g., controller 210). The circuit further includes a buck converter 1600. The buck converter is coupled with the battery 404. The buck converter includes a transistor tied to the battery and controlled by a control signal "buck" generated by the controller. FIG. 17 illustrates one example of a charge circuit employing a boost converter 1700 coupled between the electrochemical cell and the load. The circuit, like FIG. 16, includes a filter circuit 406, such as described above with reference to FIG. 4 and elsewhere, that is controlled by way of control signals, labeled "pulse" to the filter transistor from a controller (e.g., controller 210). The boost converter is coupled with the battery 404. The buck converter includes a transistor tied to the battery and controlled by a control signal "boost" generated by the controller. Other features of the circuits illustrated in FIGS. 4 and 15 may also be included in either or both of the circuits illustrated in FIGS. 16 and 17. Further, other buck or boost topologies may also be employed.

Figure 18B:
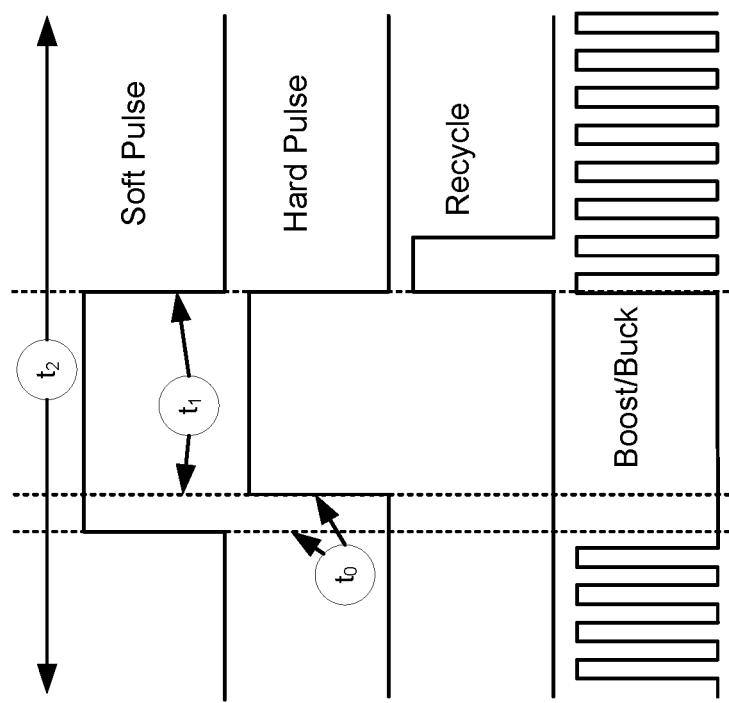
FIG. 18B is an example of control pulses of the control signals applied to the circuit of FIG. 15 to produce the harmonically tuned charge signal of FIG. 18A.
Figure 18A:
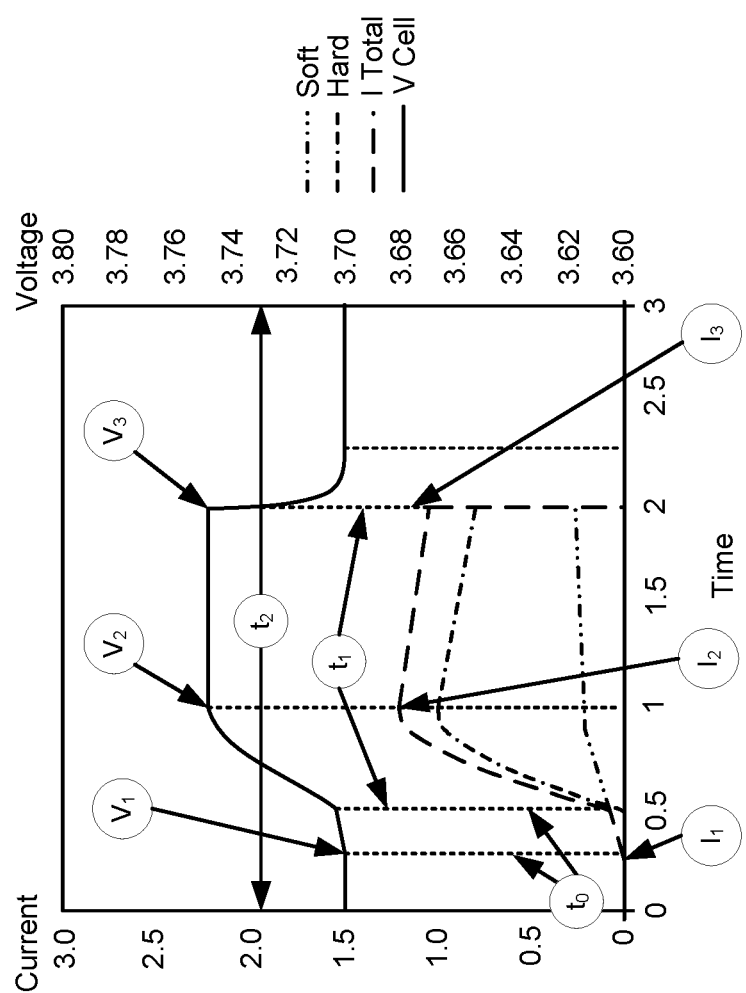
FIG. 18A is an example of harmonically tuned charge pulse produced by the control signals applied to the circuit of FIG. 15.

FIG. 18 illustrates one example of controlling the various circuits of FIGS. 15-17. The control and charge pulses relate to the circuit of FIG. 15; however, the concepts are applicable to circuits such as shown in FIGS. 16 and 17 with fewer components, or circuits with greater complexity. FIG. 18A illustrates a voltage component (upper diagram) and a current component (lower diagram) of a tuned charge pulse. As with other pulses depicted herein, the circuit may be controlled to shape the leading edge to conform to a frequency and/or harmonic associated with a relatively low or lowest impedance, including the real and/or imaginary portions thereof, of the cell being charged. Other measures may also be used, such as admittance or its components of susceptance and conductance with impedance being used in the discussed examples. The term impedance as used herein may include its inverse admittance. As noted, impedance may change over time based on state of charge, temperature, age and/or number of cycles, etc., of the electrochemical cell. Thus, the waveform may similarly change programmatically or be changed dynamically based on feedback and impedance measurements. In one example, shaping may be performed by activating different combinations of filtering circuits to employ different combinations of inductors to shape the leading edge of the charge signal. It is similarly possible to characterize impedance of a cell at various harmonics based on state of charge, temperature, age, and the like, and programmatically alter the combinations of filter circuit activations to alter the charge waveform based on any such characterizations alone or in combination rather than based on actual measurements of impedance.

Regardless, in a system that may require application of some power to a load during charge, the application of the power may be applied so as to not interfere with the shape and frequency/harmonic characteristics and/or components of the charge waveform to help avoid applying a waveform associated with sub-optimal impedance or otherwise affecting the control of the charge waveform. However, as will be appreciated from the examples discussed further below, in some instances the buck or boost circuits may be activated in some combination with the filter circuits to shape the charge pulses. Nonetheless, in one example, the operation of the buck or boost converter may be interleaved with the operation of the charge controller such that the buck or boost is not "on" during at least a portion of the charge pulse to avoid interfering with the shape of the leading edge and/or the control of the waveform shape or components. In one example, the power converter is only turned on after the charge pulse is turned off. In another example, the power converter may be turned on while the charge pulse is on but only after the leading-edge transitions to the second, "body" portion of the pulse that follows the shaped leading edge. In another example, the power converter is turned off when the charge pulse is turned on. In another example, the power converter is turned off for some time before the charge pulse is turned on.

FIG. 18B illustrates control pulses that may be applied to various components of the circuit of FIG. 15 to form and deliver the charge pulse of FIG. 18A and also deliver power to a load by activating the power converter. More particularly, three distinct control signal pulses are illustrated in FIG. 18B that are involved with forming and providing the tuned charge signal pulse. The pulses may be executed in a sequence, may be set forth at some frequency or duty cycle, and may be provided in various different arrangements depending on the shape of the desired charge pulse. The example is set forth merely to illustrate the various concepts discussed herein and should not be construed as limiting. The first pulse labeled as the "soft pulse" is applied to switch 412 and is the pulse control signal 416 of the same. The second pulse labeled as the "hard pulse" is applied to the switch of filter circuit N 418. Depending on the shape desired for the charge pulse, one or more second pulses may be applied to one or more of N filter circuits. Moreover, the second pulse may be eliminated should the first "soft pulse" be sufficient to shape the charge pulse. The third "recycle" pulse is applied to switch 422 as the recycle signal. The combination of the first and second pulse shape of the leading edge of the pulse. Depending on the inductance value for any given filter circuit and the desired harmonic characteristic of the leading edge, various possible combinations of filter circuits may be activated—the first and second sequence discussed herein is merely for example. Similarly, in various possible implementations, one or more filter circuits with the same or different inductor values may be employed, with various control schemes applied to the various filter circuits to control the leading edge of a charge pulse, define other attributes of a charge pulse or generally define the charge signal, whether a pulse or otherwise. Additionally, to provide a desired inductance value in accordance with a targeted charge pulse shape, various filter circuits may be activated in parallel and synchronously such that the inductance value is achieved by the parallel combinations of inductors from whatever combination of filter circuits are activated. Inductors may also be directly connected in series or parallel within a filter circuit to provide various possible values.

Finally, the buck/boost pulses are applied to either the buck or boost circuit portion depending on whether the circuit includes a buck or boost branch, and whether the load requires a buck or boost function for whatever the mode of its operation. As noted, in some implementations, it may be sufficient to provide either a buck or boost power converter, and in other implementations, both a buck and boost may be included. The example control pulses are examples of a discrete pulses that are part of a series of such pulses (e.g., a pulse width modulated (PWM) signal), typically applied at a high frequency, as part of a charge sequence to produce the charge sequence for charging the electrochemical device. It should be recognized from the disclosure that the control signals, which may be PWM signals, may be used to control the filter circuits (e.g., soft or hard), the recycle function, the boost and the buck circuits (e.g., PWM "buck" or "boost" control signals at the respective transistors of the buck 1600 or boost 1700 circuits, respectively), discretely and in various possible combinations, and synchronously to achieve the various possible charge and/or discharge functions discussed herein.

Referring to FIGS. 18A, 18B and 15, it can be seen that the initial rising edge of the soft pulse occurs at time T0, which turns on switch 412 causing current to beginning flowing into the electrochemical device 404 and the voltage to rise at terminal node 440 of the load. At time T1, the rising edge of the hard pulse follows the soft pulse and while the soft pulse is also still high (and circuit 406 is still active). At time T1, current from filter circuit N 418 begins flowing into the load in combination with current from circuit 406 through switch 412. Hence, the charge pulse (the leading-edge shape) is governed by the combination of filter circuits 406 and circuit N 418.

The first pulse is labeled a "soft" pulse in this example because it is activating a circuit with a relative larger inductor and hence a slower rise time of the leading edge of the pulse as current flow ramps up relatively slower in a larger inductor. The second pulse is labeled a "hard" pulse in this example because it is activating a circuit with a relatively smaller inductor and hence causes a faster rise time of the leading edge of the pulse as current flow ramps up relatively faster through the relatively smaller inductor.

In the illustrated example, two filter circuits are sequenced and combined to form the rising edge shape of the charge pulse beginning at time T0. Additional combinations may be employed to shape the rising edge to mimic a sinusoidal rising edge (e.g., with additional filter circuits and/or finer control of the filter circuit switches, the leading edge can be smoothed to be shaped similarly to a first half of a sine pulse). The various circuits N 418 can be provided with different inductor values, and control can be coordinated between any possible combinations to define the shape of the leading edge of the pulse.

At the time when V2 is reached, while the soft and hard pulse are still high, the current flow of circuit 418 N reaches its maximum when the voltage at the terminal node 440 reaches its maximum, essentially the rail voltage less any voltage drop across the switches in the filter circuits 406 and 418. Since the amount of current that can flow into the battery load is governed by voltage at the terminals and the amount of current tends to decrease at a given voltage over time, the charge current into the battery between the time labeled V2 and V3 declines while the voltage at the terminals is relatively constant.

At time T3, both the hard and soft pulses fall to zero discontinuing charge current from both the circuit 406 and the circuit 418 N. At this time, the recycle portion of the circuit may be activated through the recycle pulse being applied switch 422. As discussed herein, the recycle pulse may be activated to rapidly return the current to zero by directing charge at the terminal node to the storage capacitor 432.

Additionally or alternatively, a power converter, which may include a buck and/or a boost circuit, may be turned on to source energy to the load 1504. As introduced above, it may be desirable to power a load, e.g., power tool, mobile phone, vehicle functions, etc., simultaneously while its battery is under charge. As also introduced above, in some instances a voltage boost may be required to operate the load and in other instances a voltage buck may be required to operate the load.

As shown in FIG. 18B, the boost/buck pulses that drive either the respective boost switch or buck switch, run while the charge pulse is not active. In this example, when either the buck or boost circuit is active, between charge pulses, the battery is the source of power for either the buck or boost circuit and hence for the load. In some example, when a power converter is not active, a recycle function may be used to drive the charge pulse voltage at the terminals to zero as quickly as possible after the charge pulse is turned off at the time associated with voltage V3. In one example, a recycle pulse is applied to activate recycle switch 426. When a power converter function is present and active, the power converter may act in place of the recycle pulse or be coordinated with the same.

While shown as being active while the charge pulse is inactive, it is also possible to activate the buck or boost circuit while the charge pulse is active to further shape the pulse. Such activation, however, occurs after the rising edge, or at least after an initial portion of the rising edge, to not distort the shape of the rising edge, in one example. The activation of the buck or boost in this example may also replace the function of the shaping circuit function 428. Similarly, the buck or boost may also act in place of the recycle function to quickly return the charge pulse to zero but rather than recycle energy the buck or boost would recycle an initial energy than or in conjunction with drawing energy from the battery to power the load. It should be recognized that one or more capacitors may be used in the buck or boost branches to maintain a stable voltage at the load in the presence of possibly dynamically charging and different uses of the buck or boost circuit to shape and be coordinated with the tuned charge waveform functions.

Besides controlling power delivery to a load through a power converter, aspects of the present disclosure also involve controlling the power converter to shape output pulses delivered from the electrochemical device to the load. Shaping such pulses may be done in conjunction with charging or may be done independently. Hence, shaping the output pulses may be done with a buck circuit or boost circuit, alone or in various possible combinations, distinctly from a charge function. In one example, similar benefits realized by harmonically shaping or otherwise tuning the input charge waveform, such as by shaping at least the leading edge of charge pulses, to an electrochemical device may be realized through shaping output pulses from the electrochemical device to a load. In one example, the output waveform shape may be associated with a low or lowest impedance delivering power from the battery. In some instances, the output impedance may be assumed to be the same, or substantially the same, as the input impedance under the same conditions of the electrochemical device— e.g., under some state of charge, temperature, life cycle of the battery, etc. In other instances, the output impedance may be measured or characterized distinctly from the input impedance under different conditions, and the distinct measurements or characterization then used to select an optimal output frequency attribute, which may be a harmonic. The impedance measurement circuit 408 may be used to measure output impedance from the load at different frequencies in the same way as discussed above relative to measuring input impedance to the battery 404. Regardless, in various examples, the output waveform, e.g., tuned pulses, from the battery to a load may be shaped, and in particular examples the leading edges of the output pulses may be tuned for a particular shape corresponding to a frequency and/or harmonically shaped. The optimal harmonic or frequency attribute is associated with a value representative of a flow of electrical current to or from an electrochemical device, depending on whether we are discussing charge or discharge (delivering power from the electrochemical device).

The optimal frequency or harmonic may be associated with whatever provides the lowest input or output impedance from the electrochemical device. In any given situation, however, it may not be the absolute lowest impedance as the system may select a value near the lowest or select values as it iterates to the lowest value. In other situations, the nature of feedback loops and dynamic systems may be such that the system is selecting a value in some range around and otherwise associated with the lowest value. In a characterized system, for example, a battery may not be perfectly characterized for every state of charge, life cycle, temperature or other conditions and the characterization may make reasonable extrapolations and assumptions when selecting a harmonic component or frequency at which to define some part of a charge or discharge waveform, e.g., shape the leading edge of a discharge or charge pulse. Hence, the use of "optimal" in the context of impedance or other values representative of the flow of current to or from an electrochemical device, harmonics (frequencies), or other measures discussed herein does not necessarily mean that the lowest impedance value is known or the harmonic or frequency to provide that lowest value is known by the system. As noted elsewhere herein, other measures may also be used, such as power or admittance or its components of susceptance and conductance. In the case of admittance, the optimal value may be associated with harmonics that provide maximum admittance, or values otherwise within some range of the maximum admittance, during charge or discharge.

In one example, the leading edge of pulses leaving the battery may be shaped by controlling the switch of either a buck or a boost circuit. For example, the switch (e.g., transistor) of the buck circuit of FIG. 16 may be controlled by applying a varying duty cycle or varying period sequence of pulses at the buck input, or the boost switch of the boost circuit shown in FIG. 17 may be controlled by applying a varying duty cycle or varying period sequence of pulses at the boost input. To harmonically shape a leading edge of a pulse leaving an electrochemical device to have a sinusoidal shape of some frequency, the system controls the duty cycle or period of the PWM signal driving the buck or boost switch during the leading edge portion and then maintains the duty cycle or period for the remaining duration of the pulse.

It is also possible to tailor the charge or discharge signal harmonic, leading edge or otherwise, to align with impedance (or other value) of the electrochemical device to optimize combinations of charge or discharge interactions and effects on the electrochemical device. For example, the system can operate to balance between charge rate and cycle life of the battery (e.g., number of charge and/or discharge cycles before the battery capacity falls to some threshold— e.g., 75% (lost 25% capacity)). In some instances, the system may determine a harmonic for the highest charge rate but application of a signal to achieve that charge rate may not be optimal for cycle life. Hence, the system may apply a charge at a lesser rate than possible, which may in turn alter the harmonic component of the charge signal as applying the charge at lesser rate may impact impedance. In other instances, the system may apply harmonically tailored charge or discharge pulses with controlled combinations of duty cycle, frequency (e.g., of the charge pulse), and/or total period frequency (e.g., the combination of charge and rest) to balance between various possible real-time battery characteristics like charge rate and/or longer term battery characteristics like cycle life. For example, it is understood that relatively higher charge or discharge currents exhibit lower impedances in the cell, which generally speaking favors charge or discharge rates but the higher charge or discharge rates, even though harmonically optimized by the complex impedance feedback discussed herein, will have some impact on cycle life as does any charge and discharge of a battery. Duty cycle has a strong influence on peak current. On the other hand, for a fixed current RMS, the frequency of the lowest impedance may benefit cycle life albeit at a lesser charge rate. Hence, the system may charge or discharge to optimize balance between different factors. Stated differently, aspects of the present disclosure may be operable to enhance charge or discharge rates relative to conventional technologies, and such improvements may also be done while accommodating other desirable outcomes such as optimizing cycle life under such conditions. In some such instances, charge or discharge rates may remain improved relative to conventional systems but operated at some level less than maximum to balance other factors.

FIG. 19 illustrates one way of generating a harmonically shaped, e.g., sinusoidal, leading edge of an output signal, which may be a sequence of shaped-pulses, from the battery. Namely, the control pulse width may be varied during the shaping portion of the charge pulse. For example, the pulse width may be varied from a relatively short, mostly off, pulse width to a relatively long, mostly on, pulse width as illustrated in FIG. 19A and FIG. 19D (highlighting the area of the varying duty cycle portion of the buck/boost transistor control sequence of FIG. 19A) to form a leading edge when the voltage/currently initially rises relatively slowly and then rises relatively more quickly over the same period for each discrete pulse, simulating the shape of a sinusoidal leading edge of a discharge pulse (from the battery). The duty cycle may be uniformly increased or controlled non-uniformly to effect a variety of possible shapes. Alternatively, the same pulse width (percentage) may be employed for each discrete pulse while varying the period of each pulse.

Figure 19A:
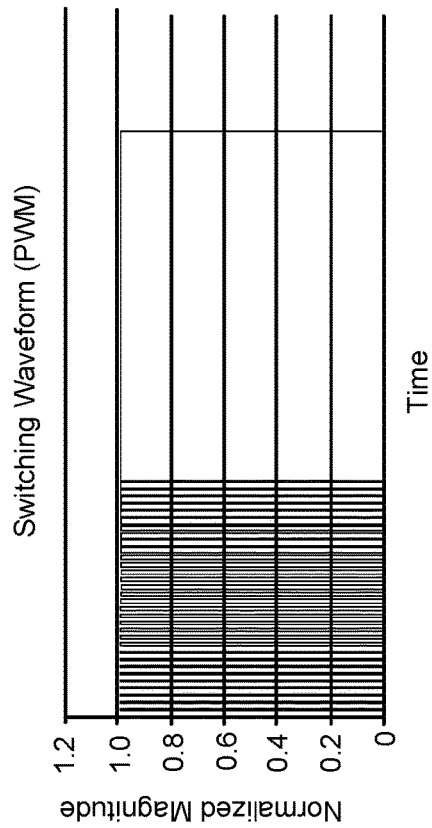
FIG. 19A is an example of control pulses for driving a charge shaping and power converter, such as through the circuit illustrated in FIG. 15, in one example.
Figure 19C:
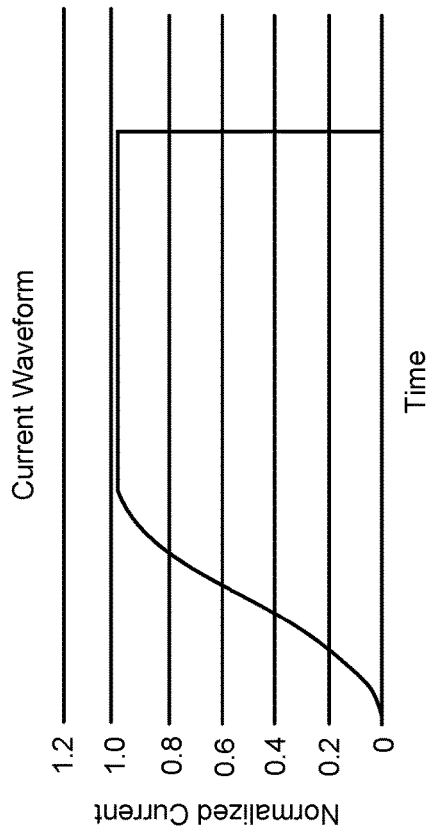
FIG. 19C is an example of a harmonically shaped output current waveform generated from a duty cycle as illustrated in FIG. 19D, in one example.
Figure 19B:
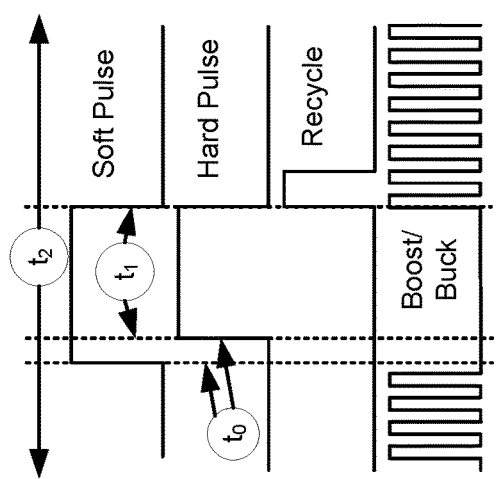
FIG. 19B is an example of a PWM signal for driving a buck or boost power converter.
Figure 19D:
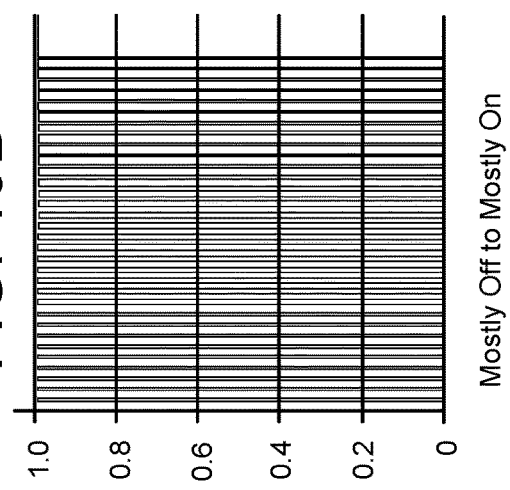
FIG. 19D is an example of altering the duty cycle of a buck or boost power converter with an initially short on cycle transitioning to a longer on cycle to shape a discharge pulse according to a harmonic, in one example.

Regardless, the control sequence illustrated in FIG. 19A, or one like it, may be applied during each discrete boost or buck pulse illustrated in FIG. 19B. The varying duty cycle and otherwise the control sequence of FIG. 19A generates a sequence of output pulses from the electrochemical device with a harmonically shaped leading edge as shown in FIG. 19C, in one example. The duty cycle or period control is controlled to form a leading edge at whatever frequency the system determines (or is characterized as) to conform with optimal output impedance of the cell. The length of application of the duty cycle or period control may also be controlled to shape the output pulse. In the example of FIG. 19C, duty cycle is controlled during the time of the shaped leading edge and to form the same; then, during the body of the pulse, the duty cycle is constant for the remainder of the pulse width.

The PWM control of the buck or boost circuit causes an output current from the battery to the load that may incrementally move up in a somewhat "staircase" fashion. The steps may be smoothed using filtering at the output of the electrochemical device. Which may be integral with the power converter or precede the same.

Figure 20A:
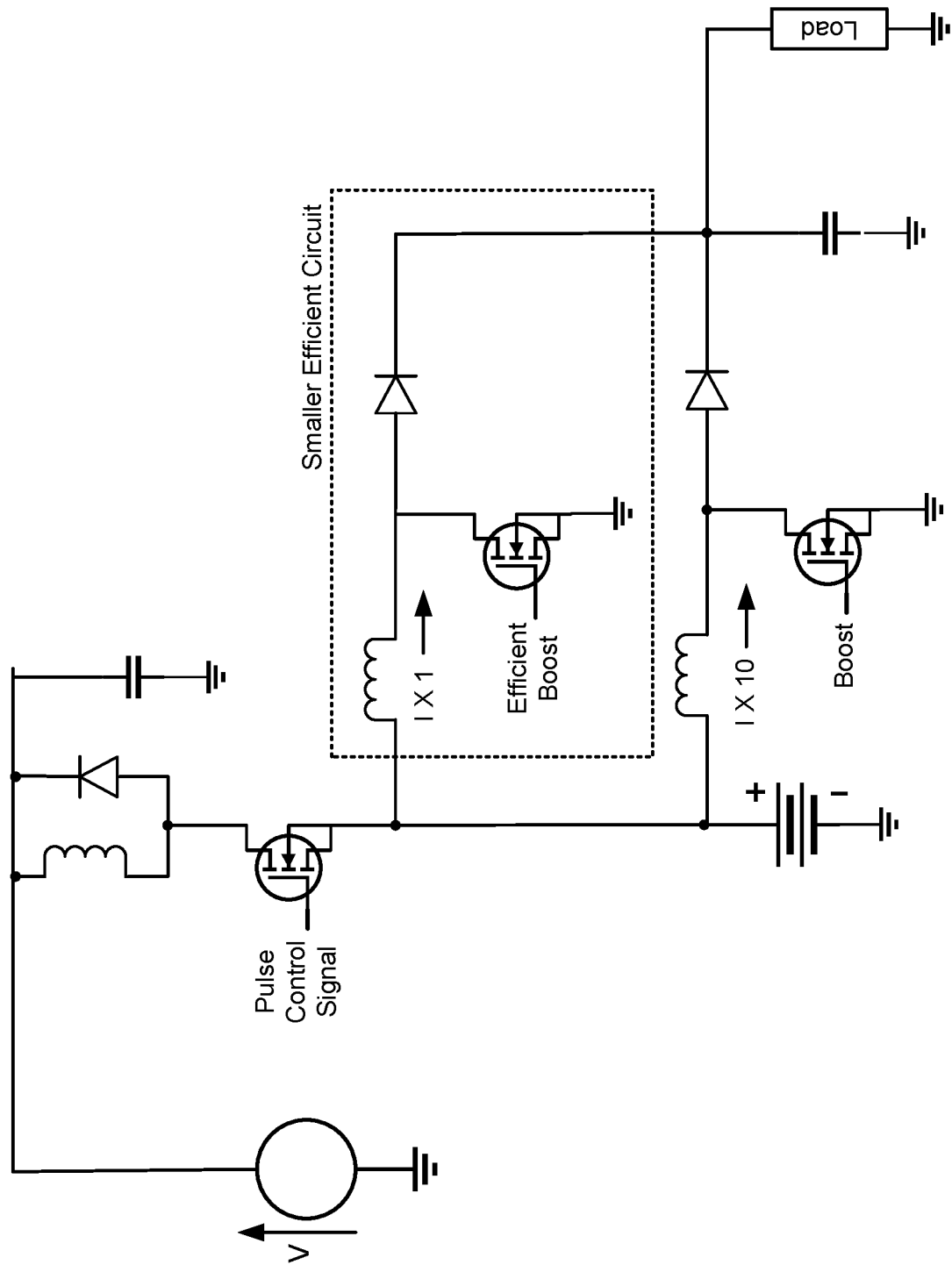
FIGS. 20A and 20C are examples of charge signal shaping circuits with parallel boost circuits.
Figure 20B:
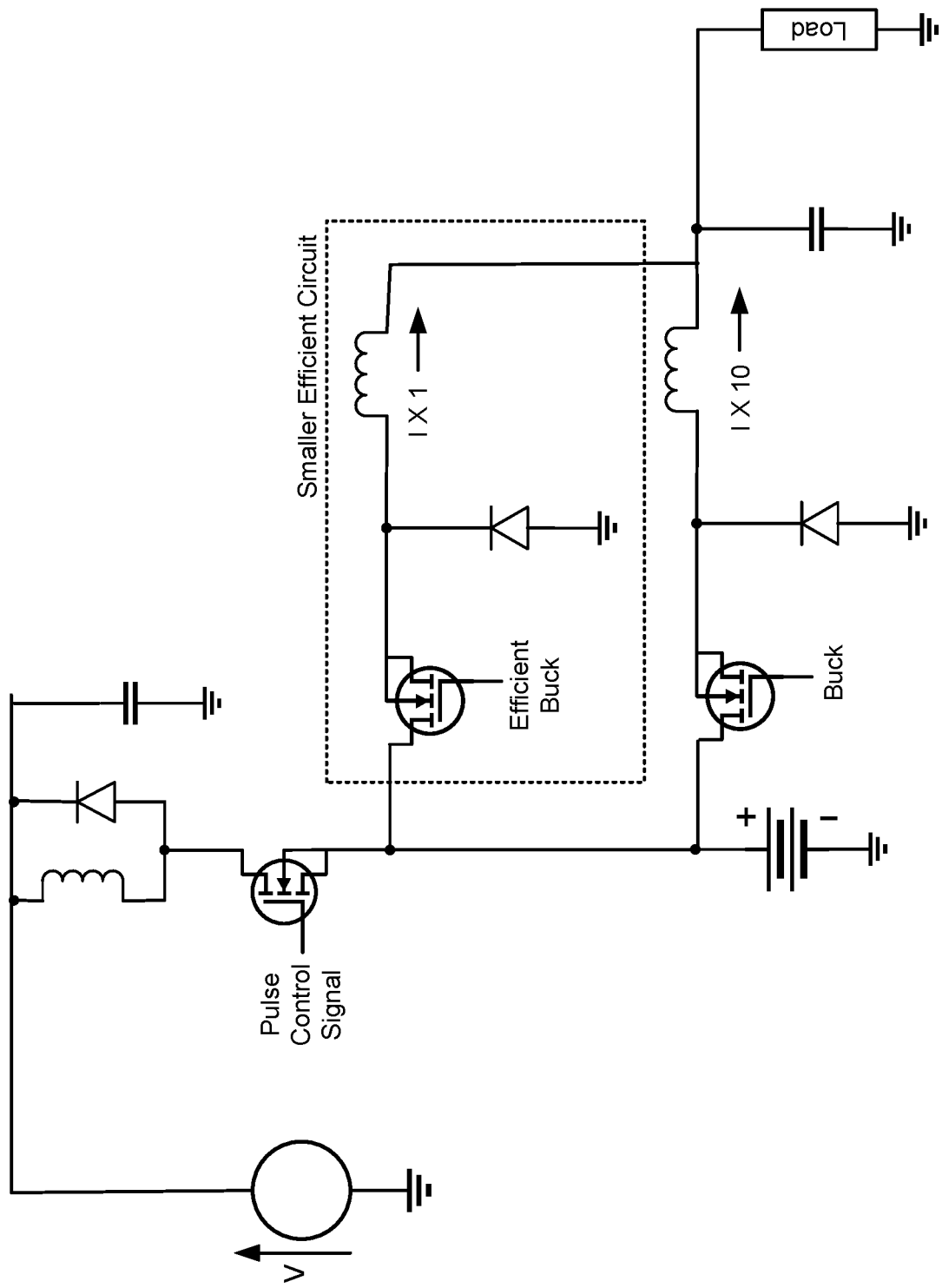
FIGS. 20B and 20D are examples of charge signal shaping circuits with parallel buck circuits, in one example.
Figure 20C:
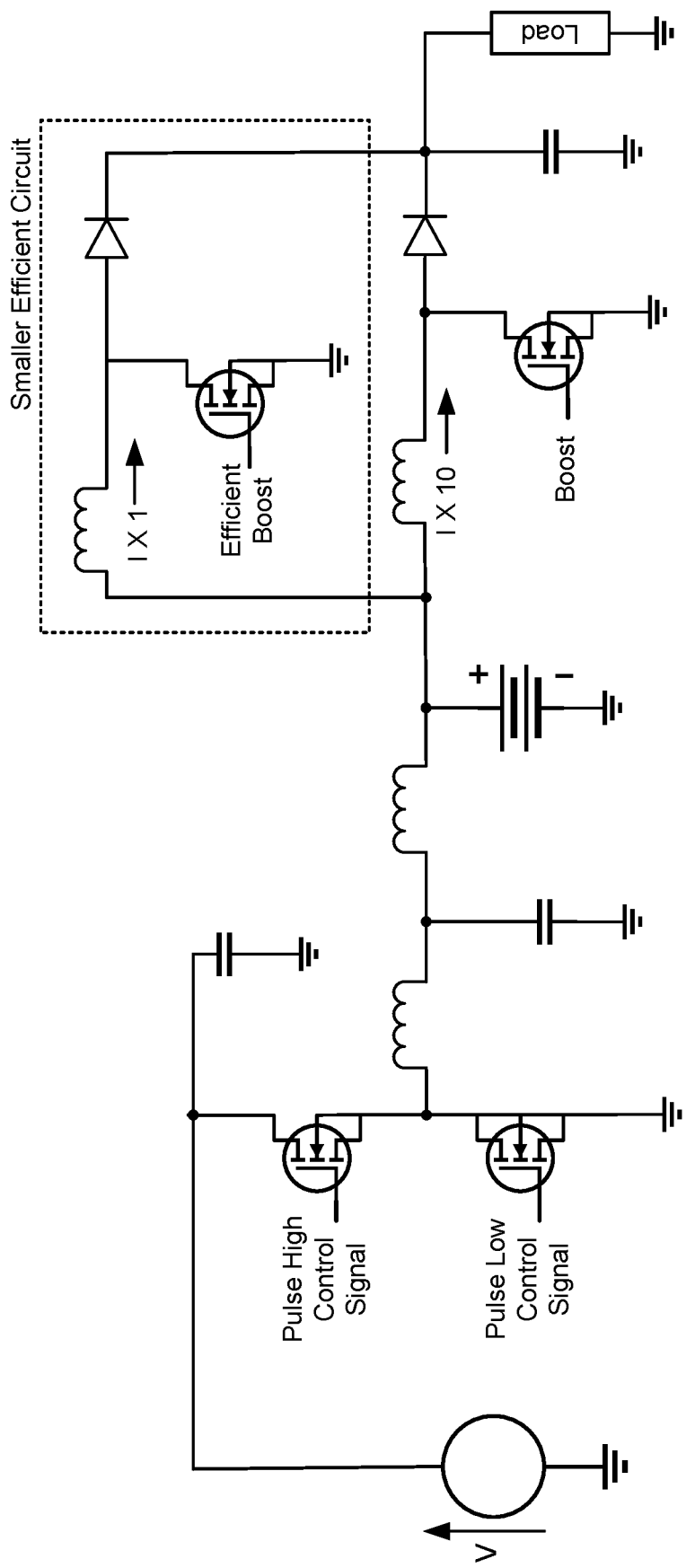
Figure 20D:
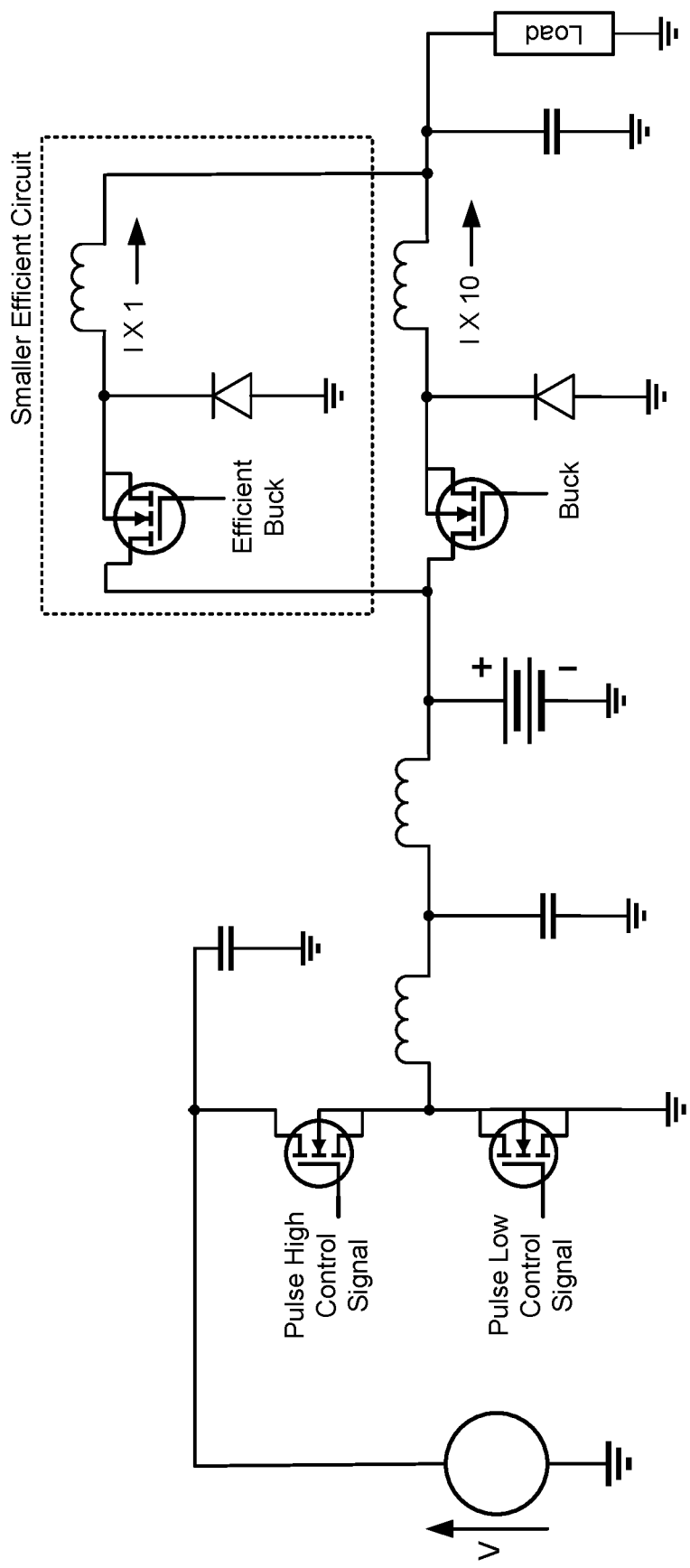

The control of the duty cycle or period of the control pulses may also be applied to shape the charge pulses. Such duty cycle control may be done alone or in combination with the methodology discussed above whereby filter circuits, and combinations of filter circuits (e.g., filter circuits 406 and 418), are selected based, at least in part, on the inductance value of the inductor 410 of each filter circuit and its effect on shaping the leading edge to conform with some frequency profile. Referring again to FIGS. 19A and 19B, an initially varying duty cycle control signal of FIG. 19A may be applied to as the pulse control signal 416 of the switch 412 and as also illustrated in the dashed box portion of the "soft" pulse of FIG. 19B. The so-called hard pulse may be used in combination as discussed above and as shown in FIG. 19B to shape the leading edge of the charge pulse, e.g., as illustrated in FIG. 18A. The duty cycle control provides additional control functionality besides the selection of various combinations of filter circuits, and may be used to more finely tailor the leading edge when using Returning to a discussion of the power converter functionality, it is possible to employ one or more boost or buck circuits in parallel as illustrated in FIGS. 20A/20C and 20B/20D. In either case, the addition of one or more parallel buck or boost topologies may provide opportunities to optimize efficiency relative to a single power converter design, provide alternative power converter paths, reduce component sizing in respective parallel paths which may reduce heat loss and improve switching efficiency among other benefits. In the examples illustrated, the boost or buck inductors in the parallel circuits are not the same, with one circuit of the pair in each having a smaller inductor value providing potentially more efficiency than the parallel circuits with larger relative inductors. The inductors may be the same in either or both cases, and additional parallel buck or boost circuits may be employed in various examples. In one example, the two or more parallel power conversion circuits may be run in parallel with each circuit sourcing power to the load, e.g., either buck or boost. In another example, each parallel power conversion circuit may use a varying duty cycle, as shown for example to shape the leading edge of the output pulse to conform with a harmonic providing an optimal output impedance, or varying the period of the pulse to the same end. In yet another, example, particularly to source less initial current, one of the circuits may be initially activating with a duty cycle to shape the leading edge of the pulse, and when a higher current and/or steady output current is desired activate one or more additional parallel circuits to source current not otherwise available for a single power converter. In some instances, it may be desirable to carefully control both the shape and the amount of output current from the electrochemical device, and providing additional parallel power converters, alone or in combination with pulse shaping control, provides flexibility for the same.

Various embodiments of the disclosure are discussed in detail above. While specific implementations are discussed, it should be understood that this is done for illustration purposes only. A person skilled in the relevant art will recognize that other components and configurations may be used without parting from the spirit and scope of the disclosure. Thus, the preceding description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated upon or discussed herein. In some cases, synonyms for certain terms are provided. A recital of one or more synonyms does not exclude the use of other synonyms. The use of examples anywhere in this specification including examples of any terms discussed herein is illustrative only and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Various modifications and additions can be made to the exemplary embodiments discussed without departing from the scope of the present invention. For example, while the embodiments described herein refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

We claim:

1. A charging system comprising:
   a charge signal shaping circuit comprising a first switch configured to receive a pulse width modulated (PWM) control signal and operably coupled with an inductor to provide a sequence of pulses to the inductor, the sequence of pulses responsive to the PWM signal;
   a controller in operable communication with the charge signal shaping circuit to control the PWM control signal, the controller configured to generate a charge current waveform with a shaped leading edge defining an increasing charge current followed by a constant current body portion by controlling a duty cycle of the sequence of pulses to the inductor, the controlled sequence of pulses producing the shaped leading edge of the charge current waveform from the inductor, and then providing a constant duty cycle of the sequence of pulses to provide the constant current body portion of the charge current waveform from the inductor.

2. The charging system of claim 1 further comprising a power converter operably coupled with an electrochemical device, the power converter to provide power to a load wherein the power converter is in operable communication with the controller, the controller to control the power converter to generate a leading edge shape of a discharge signal from the electrochemical device, the leading edge of the discharge signal shaped based on a frequency associated with a value representative of the flow of electrical current from the electrochemical device.

3. The charging system of claim 2 wherein the charge signal comprises a series of tuned charge pulses each with the shaped leading edge of the signal current waveform and the constant current body portion of the charge current waveform, and the discharge signal comprises a series of tuned discharge pulses each with the leading edge shape of the discharge signal, the controller to control the charge signal shaping circuit and the power converter to interleave the series of charge pulses with the series of discharge pulses.

4. The charging system of claim 3 wherein a tuned discharge pulse immediately follows a tuned charge pulse.

5. The charging system of claim 3 wherein a tuned discharge pulse of the series of tuned discharge pulses is activated during the constant current body portion of a tuned charge pulse of the series of tuned charge pulses.

6. The charging system of claim 2 wherein the power converter comprises at least one of a first buck converter or a first boost converter.

7. The charging system of claim 6 wherein the power converter further comprises at least one of a second buck converter in parallel with the first buck converter or a second boost converter in parallel with the first boost converter.

8. The charging system of claim 2 wherein the power converter comprises a switch to control the power converter, the switch receiving a control signal with a pulse width that varies from a mostly off pulse width to a mostly on pulse width to shape an edge of an output pulse from the load.

9. The charging system of claim 2 wherein the controller activates the power converter when the charge current waveform is off.

10. The charging system of claim 1 wherein the shaped leading edge defining an increasing charge current is of the shape of a sinusoid corresponding to a frequency associated with a value representative of a flow of electrical current to an electrochemical device.

11. The charging system of claim 10 wherein the PWM control signal has a controlled varying duty cycle or controlled varying period to produce the series of pulses to the inductor, wherein the increasing charge current produced from the inductor receiving the series of pulses generates the shape of the leading edge as the increasing charge current of the shape of the sinusoid corresponding to the frequency.

12. The charging system of claim 10 wherein the value is at least one of impedance, admittance and power.

* * * * *

UNITED STATES PATENT AND TRADEMARK OFFICE
CERTIFICATE OF CORRECTION

PATENT NO. : 12,431,728 B2  
APPLICATION NO. : 17/390851  
DATED : September 30, 2025  
INVENTOR(S) : Daniel A. Konopka et al.

Page 1 of 1

It is certified that error appears in the above-identified patent and that said Letters Patent is hereby corrected as shown below:

In the Claims

In Claim 3, Column 42, Line 3, delete "signal"

Signed and Sealed this  
Twenty-eighth Day of October, 2025

John A. Squires  
*Director of the United States Patent and Trademark Office*